US008294489B2

(12) United States Patent
Tanamoto et al.

(10) Patent No.: US 8,294,489 B2
(45) Date of Patent: Oct. 23, 2012

(54) PROGRAMMABLE LOGIC CIRCUIT

(75) Inventors: Tetsufumi Tanamoto, Kawasaki (JP);
 Hideyuki Sugiyama, Kawasaki (JP);
 Kazutaka Ikegami, Tokyo (JP);
 Yoshiaki Saito, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 523 days.

(21) Appl. No.: 12/404,606

(22) Filed: Mar. 16, 2009

(65) Prior Publication Data
 US 2010/0073025 A1 Mar. 25, 2010

(30) Foreign Application Priority Data
 Sep. 25, 2008 (JP) ................................. 2008-245532

(51) Int. Cl.
 *H03K 19/177* (2006.01)
(52) U.S. Cl. ....... 326/41; 326/38; 365/189.11; 365/145; 257/295
(58) Field of Classification Search .............. 326/37–47, 326/113; 365/158, 189.011–214, 230.01–232
 See application file for complete search history.

(56) References Cited

U.S. PATENT DOCUMENTS

| 4,617,479 | A | 10/1986 | Hartmann et al. | |
|---|---|---|---|---|
| 5,565,695 | A * | 10/1996 | Johnson | 257/295 |
| 7,411,235 | B2 | 8/2008 | Saito et al. | |
| 2002/0044481 | A1 * | 4/2002 | Hidaka | 365/158 |
| 2003/0156448 | A1 * | 8/2003 | Hidaka | 365/171 |
| 2008/0061332 | A1 | 3/2008 | Saito et al. | |

FOREIGN PATENT DOCUMENTS

JP   2008-42114   2/2008

OTHER PUBLICATIONS

U.S. Appl. No. 12/339,638, filed Dec. 19, 2008, Hideyuki Sugiyama, et al.
Satoshi Sugahara, et al., "Spin MOSFETs as a Basis for Spintronics", ACM Transactions of Storage, vol. 2, No. 2, May 2006, pp. 197-219.

* cited by examiner

*Primary Examiner* — Shawki S Ismail
*Assistant Examiner* — Christopher Lo
(74) *Attorney, Agent, or Firm* — Oblon, Spivak, McClelland, Maier & Neustadt, L.L.P.

(57) ABSTRACT

A programmable logic circuit includes: an input circuit configured to receive a plurality of input signals; and a programmable cell array including a plurality of unit programmable cells arranged in a matrix form, each of the unit programmable cells including a first memory circuit of resistance change type including a first transistor and a second memory circuit of resistance change type including a second transistor, the first and second memory circuits connected in parallel, each gate of the first transistors on same row respectively receiving one input signal, each gate of the second transistors on same row receiving an inverted signal of the one input signal, output terminals of the first and second memory circuits on same column being connected to a common output line.

13 Claims, 24 Drawing Sheets

PROGRAMMABLE LOGIC CIRCUIT

CROSS-REFERENCE TO RELATED APPLICATION

This application is based upon and claims the benefit of priority from prior Japanese Patent Application No. 2008-245532 filed on Sep. 25, 2008 in Japan, the entire contents of which are incorporated herein by reference.

BACKGROUND

1. Technical Field

Described herein is a programmable logic circuit.

2. Related Art

The programmable logic circuit (also referred to as PLA (Programmable Logic Array)) is a rewritable basic logic circuit used in a large number of applications such as multiplexers, decoders, comparators or state machines.

In the conventional circuit utilizing the PLA such as a CPLD (Complex Programmable Logic Device), the main current is a circuit utilizing a storage device having a charge storage structure of floating gate (hereinafter, also referred to as FG) type in a transistor, such as the EPROM (Erasable Programmable Read Only Memory), EEPROM (Electronically Erasable and Programmable Read Only Memory) or a NAND flash memory. Such a circuit has been utilized in many applications (see, for example, U.S. Pat. No. 4,617,479).

As the transistors become finer, however, problems described below are posed. As the transistors become finer, the floating gate is also made finer. In many cases, floating gates having the same size in gate length are formed. As a result, the charge amount stored in the floating gate also decreases and dispersion of the stored charge is posing a problem.

Since charge stored in the floating gate decreases as a stochastic phenomenon even when it is retained, there is also a problem that the retention time decreases as the floating gate becomes finer. In other words, the finer floating gate brings about a negative effect in writing and retaining the charge. It is also pointed out that the tolerance is decreased and the number of times of rewriting is also limited by making various insulation films thinner at the same time. Typically, an error correction circuit is needed. If the error rate is increased, however, then it becomes impossible to do without simple error correction and a large-scale circuit becomes necessary, and consequently the effect of the finer floating gate might be canceled.

On the other hand, for writing charge into an element (FG type element) having a floating gate, a high voltage of at least 10 V is needed, resulting in a bad influence upon the circuit load and reliability. Furthermore, since the floating gate uses charge, there is a problem that it has a weakness for cosmic rays and software errors are apt to occur. This means that utilization of the FG type device serving as a storage element is limited in the case where LSIs are utilized in situations where a mistake causes a serious accident in an ultimate natural environment such as nuclear facilities or the cosmic space.

SUMMARY

Possible embodiments of this invention are made in view of these circumstances, and some embodiments of this invention may provide a programmable logic circuit capable of suppressing the influence of making memory devices fine upon writing and retaining characteristics as small as possible and capable of suppressing occurrence of software errors.

A programmable logic circuit according to an aspect of the present invention includes: an input circuit configured to receive a plurality of input signals; and a programmable cell array including a plurality of unit programmable cells arranged in a matrix form, each of the unit programmable cells including a first memory circuit of resistance change type including a first transistor and a second memory circuit of resistance change type including a second transistor, the first and second memory circuits connected in parallel, each gate of the first transistors on same row respectively receiving one input signal, each gate of the second transistors on same row receiving an inverted signal of the one input signal, output terminals of the first and second memory circuits on same column being connected to a common output line.

DETAILED DESCRIPTION

Hereinafter, embodiments of the present invention will be described with reference to the drawings.

First, sum of product used in logical operation of a programmable logic circuit according to an embodiment of the present invention will now be described.

Sum of Product

Figure 17:
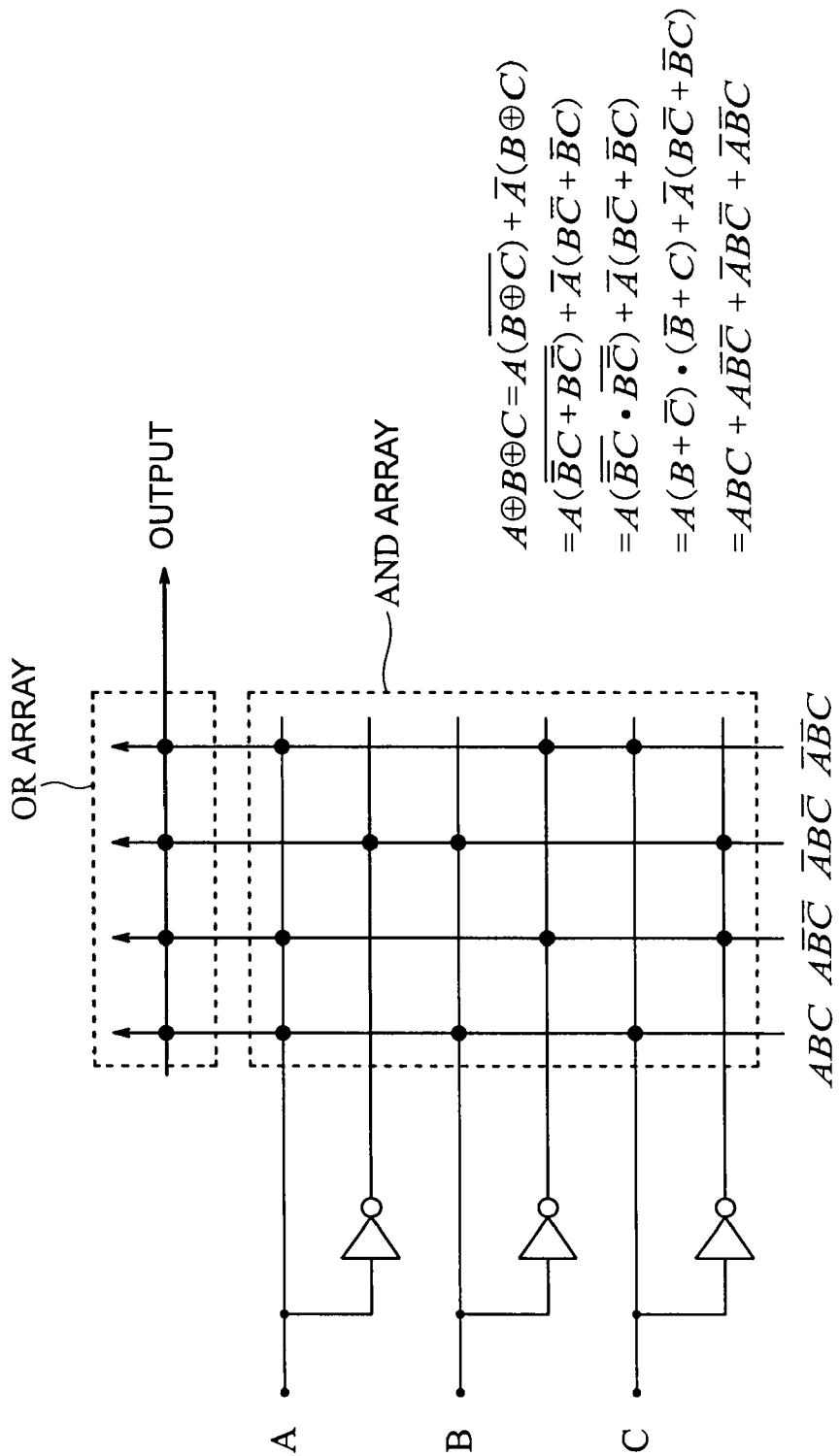
FIG. 17 is a diagram for explaining a sum of product circuit.

In a logical operation circuit used in an embodiment of the present invention, a logical operation represented by a truth table is implemented by using a circuit including an AND array and an OR array formed by combining transistors as shown in FIG. 17. In FIG. 17, each black dot (•) represents that wires are connected together. For example, operation of exclusive OR (hereinafter, also referred to as XOR) of three inputs A, B and C is represented by the following expression.

$$A \oplus B \oplus C = A(\overline{B \oplus C}) + \overline{A}(B \oplus C)$$

$$= A(\overline{\overline{B}C + B\overline{C}}) + \overline{A}(\overline{B}C + B\overline{C})$$

$$= A(\overline{(\overline{B}C)} \cdot \overline{(B\overline{C})}) + \overline{A}(\overline{B}C + B\overline{C})$$

$$= A(B + \overline{C}) \cdot (\overline{B} + C) + \overline{A}(\overline{B}C + B\overline{C})$$

$$= ABC + A\overline{B}\overline{C} + \overline{A}\overline{B}C + \overline{A}B\overline{C}$$

In other words, it can be described as a sum of
ABC, A$\overline{BC}$, $\overline{A}\overline{B}$C, $\overline{A}$B$\overline{C}$
which are products of input signals A, B and C and inverted signals /A, /B and /C obtained by inverting these input signals. An arbitrary logic can be implemented by adjusting connections between wires in an "AND array" (or an AND plane) as shown in FIG. 17 for products and in an "OR array" (or an OR plane) as shown in FIG. 17 for a sum. Such a scheme is referred to as sum of product, and the AND plane is referred to as product term. There are several degrees of freedom in the implementation method of the AND-OR operation. In an embodiment of the present invention, a NOR-NOR operation is mainly used as the implementation method.

In the programmable logic circuit according to an embodiment of the present invention, resistance change type elements such as spin transistors are used as storage elements instead of transistors having the FG type structure such as EPROMs or EEPROMs.

Spin Transistor

In the present specification, the transistor means a MOSFET (Metal-Oxide-Semiconductor Field Effect Transistor). However, the transistor may be any element as long as a current flowing between a source electrode and a drain electrode is turned on/off by applying a gate voltage. Herein, the spin transistor is also described by using the MOSFET type as usual, and it is referred to simply as spin transistor. In the spin transistor, a ferromagnetic material layer exists in its source electrode and drain electrode.

Figure 1A:
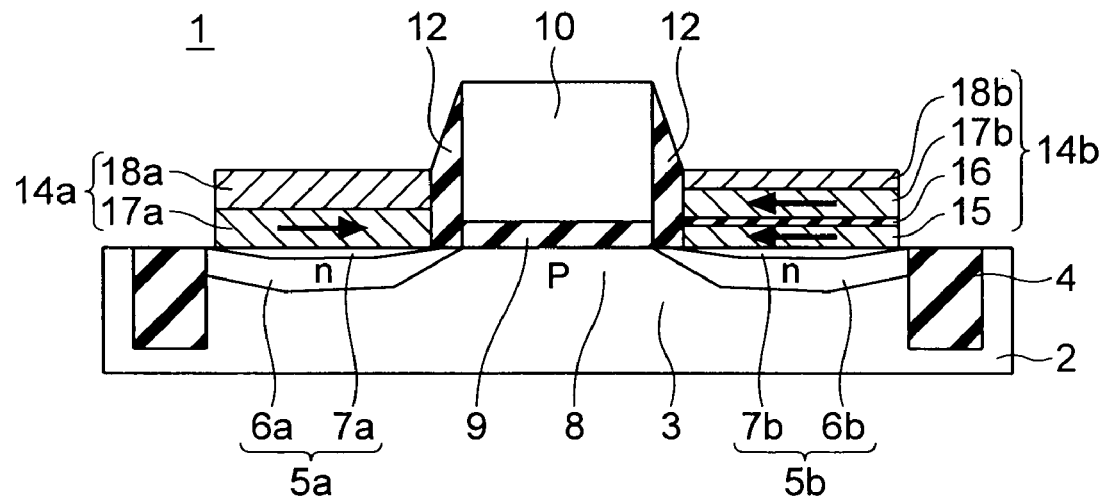
FIGS. 1A and 1B are sectional views showing a specific example of a spin transistor.
Figure 1B:
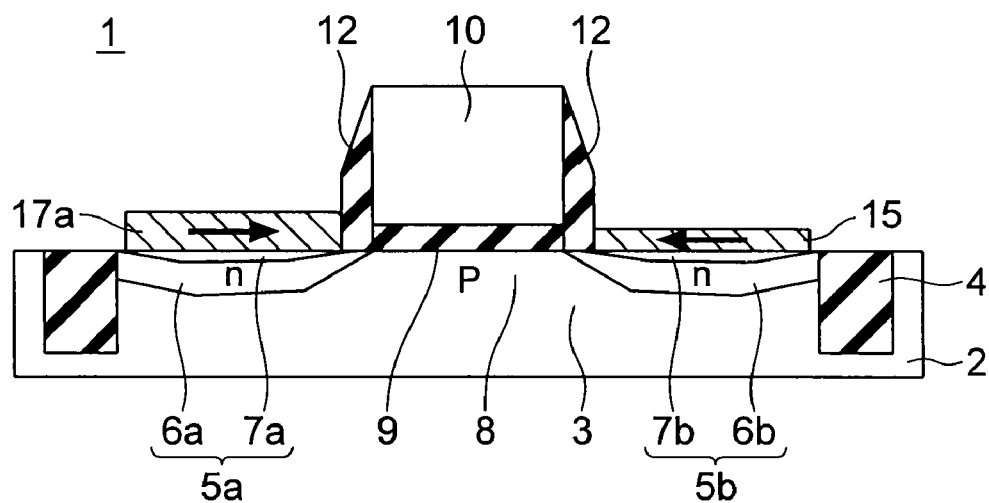

A specific example of spin transistors used in an embodiment of the present invention is shown in FIGS. 1A and 1B. The spin transistor in this specific example is an n-type spin MOSFET, and it is formed in an element region 3 of a p-type semiconductor substrate (for example, a p-type Si substrate) 2. This element region 3 is a semiconductor region separated by an element isolation insulation film 4. The semiconductor region may be a region of a part of the semiconductor substrate, or may be a well region formed in the semiconductor substrate. The semiconductor region may be a SOI layer of a SOI (Silicon On Insulator) substrate. In the element region 3, n-type impurity diffusion regions 6a and 6b formed at a distance from each other are provided. On surfaces of the n-type impurity diffusion region 6a and the n-type impurity diffusion region 6b, an n$^+$-type impurity diffusion region 7a and an n$^+$-type impurity diffusion region 7b, which are higher in concentration than the n-type impurity diffusion region 6a and the n-type impurity diffusion region 6b, are provided, respectively. The n-type impurity diffusion region 6a and the n$^+$-type impurity diffusion region 7a constitute a source region 5a, and the n-type impurity diffusion region 6b and the n$^+$-type impurity diffusion region 7b constitute a drain region 5b.

FIG. 1A shows a spin transistor having a ferromagnetic tunnel junction (MTJ (Magnetic Tunnel Junction)), and FIG. 1B shows a simpler spin transistor. A gate insulation film 9 is provided on a part of the semiconductor substrate 2 which serves as a channel region 8 between the source region 5a and the drain region 5b. A control gate 10 formed of, for example, a non-magnetic metal is provided on the gate insulation film 9. A source electrode 14a having a ferromagnetic material structure is formed on the source region 5a, and a drain electrode 14b having a ferromagnetic material structure is formed on the drain region 5b. The source electrode 14a includes a ferromagnetic layer 17a serving as a magnetization pinned layer formed on the source region 5a and of which magnetization direction is pinned, and an antiferromagnetic layer 18a formed on the ferromagnetic layer 17a to pin a magnetization direction of the ferromagnetic layer 17a.

On the other hand, the drain electrode 14b includes a ferromagnetic layer 15 formed on the drain region 5b to serve as a magnetization free layer of which magnetization direction is changeable, a non-magnetic layer 16 formed on the ferromagnetic layer 15, a ferromagnetic layer 17b formed on the non-magnetic layer 16 to serve as a magnetization pinned layer of which magnetization direction is pinned, and an antiferromagnetic layer 18b formed on the ferromagnetic layer 17b to pin a magnetization direction of the ferromagnetic layer 17b. If the non-magnetic layer 16 is a tunnel barrier, the drain electrode 14b becomes a ferromagnetic tunnel junction. And the ferromagnetic layer 15 is substantially parallel to the film surface in magnetization direction (spin direction). The ferromagnetic layers 17a and 17b are substantially parallel to the film surface in magnetization direction, and are opposite to each other (antiparallel). By the way, in the present specification, the "film surface" means the top surface of the ferromagnetic layer. Each of the magnetization free layer 15 and the magnetization pinned layers 17a and 17b shown in FIG. 1A is nearly parallel to the film surface. Alternatively, the magnetization direction may be made substantially perpendicular to the film surface by changing the material. In this case, the ferromagnetic layers 18a and 18b become unnecessary. A structure shown in FIG. 1B is obtained by removing the ferromagnetic layer 17b, the antiferromagnetic layers 18a and 18b, and the non-magnetic layer 16 from the structure shown in FIG. 1A.

The source electrode 14a and the control gate 10 are insulated from each other by a gate sidewall 12 formed of an insulating material. The drain electrode 14b and the control gate 10 are insulated from each other by a gate sidewall 12 formed of an insulating material.

Figure 2A:
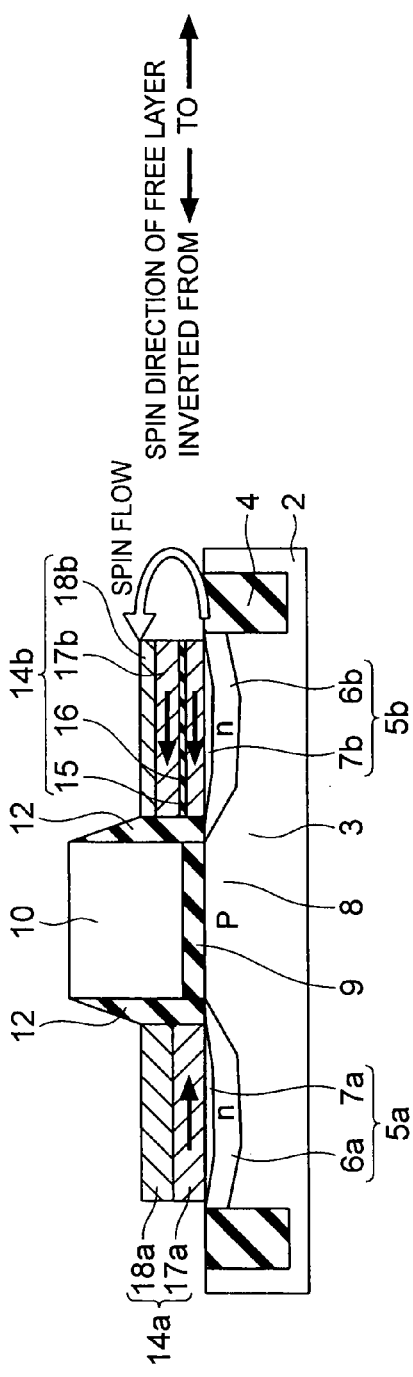
FIGS. 2A and 2B are diagrams for explaining writing into the spin transistor shown in FIG. 1.
Figure 2B:
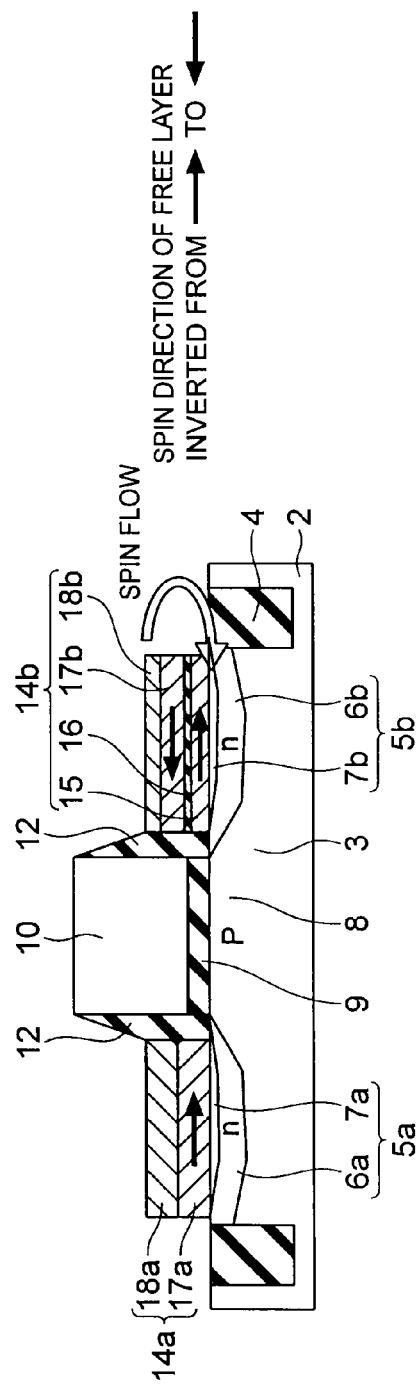

Writing and reading for the spin transistor shown in FIG. 1A will now be described with reference to FIGS. 2A and 2B. Operation of the transistor shown in FIG. 1B will be described below. As for the magnetization directions of the magnetization pinned layer 17a and the magnetization free layer 15, the same operation as that in FIG. 1A is performed.

At the time of writing operation, a gate voltage which does not change the spin direction of spin-polarized electrons when passing through the channel region 8 is used. In the spin transistor shown in FIG. 1A, the magnetization direction of the magnetization pinned layer 17b is substantially opposite to (substantially antiparallel to) the magnetization direction of the magnetization pinned layer 17a. In the case where the spin direction of the magnetization free layer 15 is substantially parallel to the spin direction of the magnetization pinned layer 17a (the case shown in FIG. 2A), if the spin direction of spin-polarized electrons, which have passed through the channel region 8 are transferred to the magnetization free layer 15 without being changed in spin direction when passing through the channel region 8, and then the spin torque acts upon the magnetization free layer 15. In addition, electrons, which have passed through the magnetization free layer 15, are reflected by the magnetization pinned layer 17b and flow into the magnetization free layer 15. As a result, a double spin torque acts upon the magnetization free layer 15, and an inversion current density at the time of magnetization inversion caused by spin injection can be reduced. In the case where the spin direction of the magnetization free layer 15 is parallel to the spin direction of the magnetization pinned layer 17a (the case shown in FIG. 2B), if the spin-polarized electrons are injected from the magnetization pinned layer 17b side into the channel region 8 via the magnetization free layer 15. The electrons spin-polarized by the magnetization pinned layer 17b are transferred to the magnetization free layer 15, and the spin torque acts upon the magnetization free layer 15. In addition, electrons, which have passed through the magnetization free layer 15, are transferred to the magnetization pinned layer 17a without being changed in spin direction when passing through the channel region 8, and are reflected by the magnetization pinned layer 17a. The reflected electrons are transferred to the magnetization free layer 15 without being changed in spin direction when passing through the channel region 8. As a result, a double spin torque acts upon the magnetization free layer 15, and an inversion current density at the time of magnetization inversion caused by spin injection can be reduced.

At the time of reading operation, a gate voltage, which changes the spin direction of the electrons by approximately 180° while the electrons are passing through the channel region 8, is used. In the case where the spin direction of the magnetization free layer 15 is substantially parallel to the spin direction of the magnetization pinned layer 17a (the case shown in FIG. 2B), therefore, the resistance of the channel region 8 becomes higher as compared with the case where the spin direction of the electrons is not rotated by 180° when passing through the channel region 8. Since the magnetization free layer 15 is substantially antiparallel in magnetization direction to the magnetization pinned layer 17b at this time, resistance between the magnetization free layer 15 and the magnetization pinned layer 17b is higher as compared with the case where the magnetization free layer 15 is substantially parallel in magnetization direction to the magnetization pinned layer 17b.

In the case where the spin direction of the magnetization free layer 15 is substantially antiparallel to the spin direction of the magnetization pinned layer 17a, the resistance of the channel region 8 becomes lower as compared with the case where the spin direction of the electrons is not rotated by 180° when passing through the channel region 8. Since the magnetization free layer 15 is substantially parallel in magnetization direction to the magnetization pinned layer 17b at this time, the resistance between the magnetization free layer 15 and the magnetization pinned layer 17b is lower as compared with the case where the magnetization free layer 15 is substantially antiparallel in magnetization direction to the magnetization pinned layer 17b.

If a gate voltage which changes the spin direction of electrons by approximately 180° while the electrons are passing through the channel region 8 of the spin transistor shown in FIG. 1A is used at the time of reading, then a difference in the sum of the resistance of the channel region 8 and the resistance between the magnetization free layer 15 and the magnetization pinned layer 17b between different states of magnetization direction of the magnetization free layer 15 becomes larger as compared with the case where a gate voltage which does not change the spin direction of spin-polarized electrons when passing through the channel region 8 is used. In other words, since a magnetoresistive change rate of a multilayer structure is added to a magnetoresistive change rate caused via the channel region 8, a readout output is increased remarkably.

Since a favorable gate voltage at the time of writing operation and a favorable gate voltage at the time of reading operation change according to the kind of the substrate and the amount of doping to the substrate, it is necessary to adjust them suitably. If the kind of the substrate and the amount of doping to the substrate are made constant, however, their values become constant.

In the spin transistors shown in FIGS. 1A and 1B, the source electrode 14a and the drain electrode 14b each having the ferromagnetic material structure are formed directly on the source region 5a and the drain region 5b, respectively. Alternatively, a tunnel insulation film (not illustrated) may be provided between the source region 5a and the source electrode 14a having the ferromagnetic material structure and between the drain region 5b and the drain electrode 14b having the ferromagnetic material structure. In this case, diffusion of the semiconductor and the magnetic material is suppressed. In addition, even if a low-resistance material is used as the magnetic material, the magnetoresistive change rate caused via the channel region 8 can be observed at the room temperature, resulting in improved characteristics. Other specific examples of the spin transistor are described in detail in JP-A No. 2008-66596 (KOKAI) applied for a Patent by the present applicant.

As described above, in the spin transistor, a difference is generated in the resistance between the source electrode and the drain electrode depending upon whether the spin direction of the magnetic material on the source region and the spin direction of the magnetic material on the drain region (or magnetization direction) are the same (parallel) or opposite (antiparallel) as described above. Representing a high resistance by $R_H$ and a low resistance by $R_L$, the MR ratio is defined as $$MR = (R_H - R_L)/R_L \quad (1)$$

and it becomes one of performance indexes of the spin transistor. By the way, as for the difference between the high resistance and the low resistance, the magnetization directions of the two magnetic material structures need not become perfectly parallel and antiparallel as described in a picture. It is sufficient that the resistance is changed by changing the magnetization direction. In the ensuing description, terms "parallel" and "antiparallel" are used for easy understanding. In some cases, a high resistance state is brought about when the spin directions are parallel and a low resistance state is brought about when the spin directions are antiparallel. Furthermore, $R_H$ and $R_L$, originally depend upon the potential difference between the source electrode and the drain electrode. Since the ensuing description holds true if there is a difference in resistance, however, they are simply denoted by $R_H$ and $R_L$.

By the way, it is also possible to dispose a current-flowing wire near the drain electrode of the spin transistor and change the magnetization direction of the magnetization free layer which forms the magnetic material structure of the drain electrode by using a magnetic field generated by the current. In the ensuing description, it is assumed that the spin transistor operates in a region where the magnetization of the magnetization free layer does not invert. As a matter of fact, the time of programming and the time of operation can be changed over by the circuit operation.

Figures 3A, 3B:
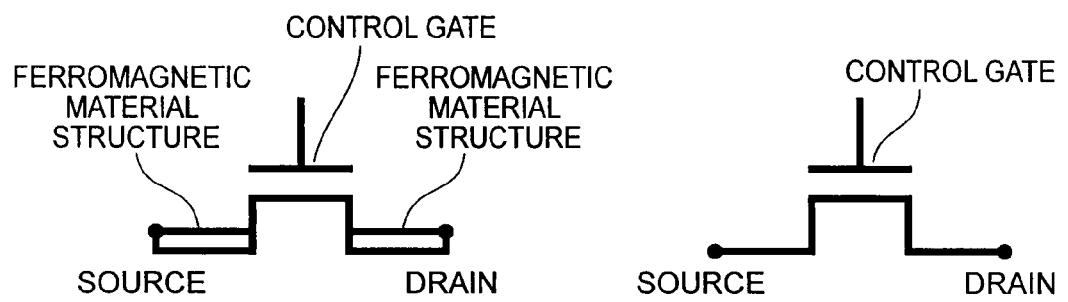
FIGS. 3A and 3B are diagrams showing symbols respectively representing the spin transistor and an ordinary transistor.

In the programmable logic circuit according to an embodiment of the present invention, the programmed state and the non-programmed state are distinguished by a low resistance state and a high resistance state of an element of resistance change type. In the case where a magnetoresistive element such as a spin transistor is used, it can be distinguished depending upon whether the magnetization direction of the magnetic material in the source electrode and that in the drain electrode are "parallel" or "antiparallel." When they are parallel, a high resistance is brought about in some cases. In the ensuing drawings, the state in which they are parallel is mainly represented as the low resistance state. Unlike ordinary transistors, the spin transistor used in an embodiment of the present invention does not depend upon a shift of the threshold as to whether it turns on or off. In the ensuing description, the spin transistor is represented by a symbol shown in FIG. 3A, and an ordinary transistor is represented by a symbol shown in FIG. 3B.

In the programmable logic circuit according to an embodiment of the present invention, it is possible to make a selection from two kinds: the case where the high resistance state is regarded as the programmed state and the case where the low resistance state is regarded as the programmed state. As for the difference between them, the application range differs according to values of the high resistance $R_H$ and the low resistance $R_L$. In the ensuing description, it is assumed that a first programmed state has the high resistance.

In the present specification, the case where a voltage input to the gate electrode of the transistor is high is represented as "1" and the case where the voltage is low is represented as "0" for brevity. However, they may be reversed.

First Embodiment

Figure 4:
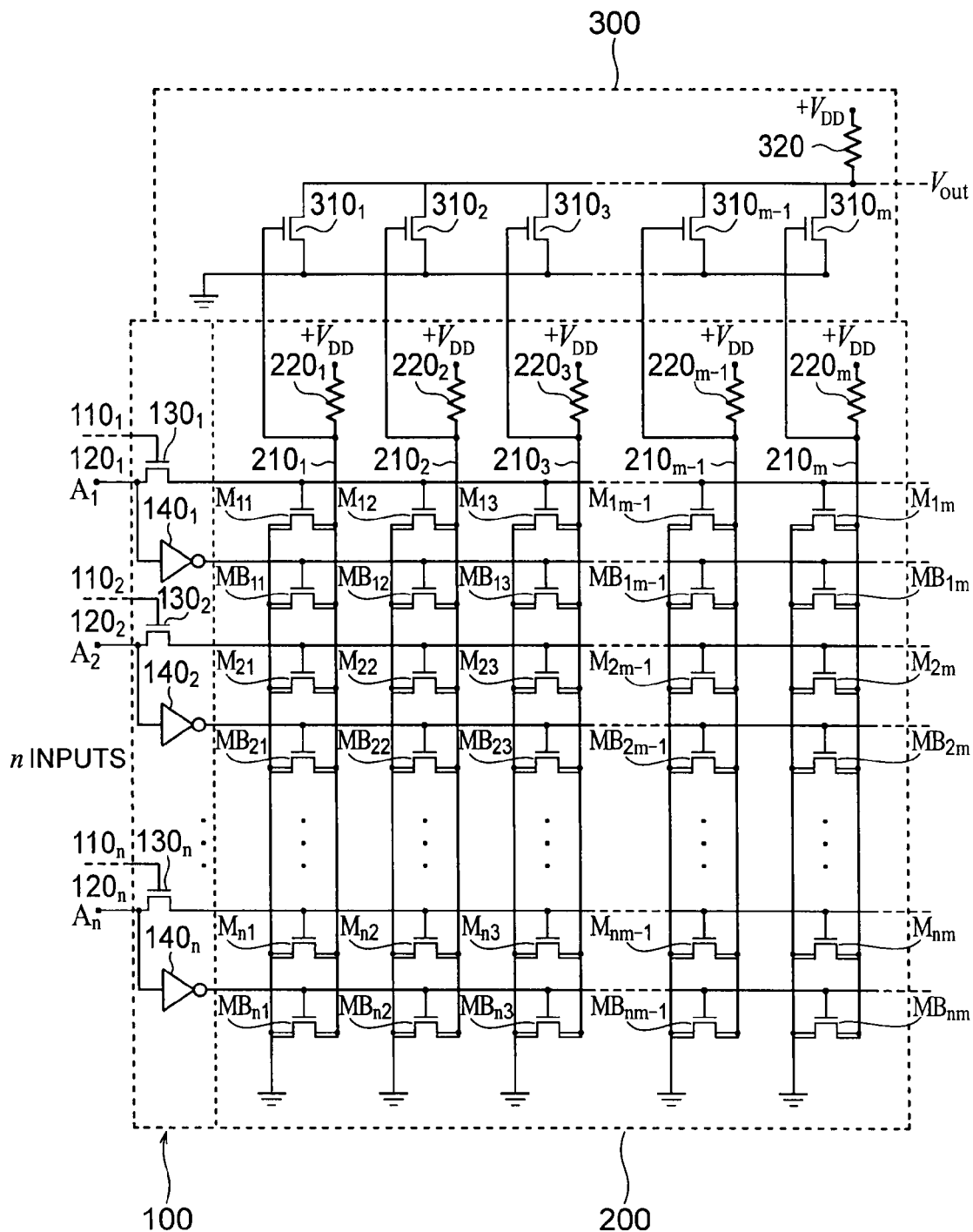
FIG. 4 is a circuit diagram showing a programmable logic circuit according to a first embodiment.

A programmable logic circuit according to a first embodiment is shown in FIG. 4. The programmable logic circuit according to the present embodiment includes an input part 100, a storage element array 200, and a NOR gate 300. The input part 100 receives n input signals $A_1, A_2, \ldots, A_n$ from the outside. The input part 100 includes n input terminals $120_1$ to $120_n$, n MOS transistors $130_1$ to $130_n$, and n inverters $140_1$ to $140_n$. The MOS transistor $130_i$ (i=1, ..., n) receives an input signal $A_i$ which is input via the input terminal $120_i$ at its first end, and receives a gate control signal $110_i$ at its gate. The inverter $140_i$ receives the input signal $A_i$ which is input via the input terminal $120_i$.

A storage element array 200 includes n×m first spin transistors $M_{11}$ to $M_{nm}$ arranged in a matrix form, n×m second spin transistors $MB_{11}$ to $MB_{nm}$ arranged in a matrix form, m NOR lines $210_1$ to $210_m$, and m load resistors $220_1$ to $220_m$. Each of the first spin transistors $M_{i1}$ to $M_{im}$ arranged in an ith (i=1, ..., n) row receives the input signal $A_i$ via the MOS transistor $130_i$ at its gate. Furthermore, each of the second spin transistors $MB_{i1}$ to $MB_{im}$ arranged in the ith row receives an inverted signal $/A_i$ of the input signal $A_i$ which is obtained by inversion in the inverter $140_i$ at its gate. The first spin transistors $M_{1j}$ to $M_{nj}$ and the second spin transistors $MB_{1j}$ to $MB_{nj}$ arranged in a jth (j=1, ..., m) column are connected in parallel, and first ends of them are connected to the ground whereas seconds of them are connected to the NOR line $210_j$. A first end of the load resistor $220_j$ (j=1, ..., m) is connected to the NOR line $210_j$ and a second end of the load resistor $220_j$ is connected to a power supply $V_{DD}$.

Figure 5:
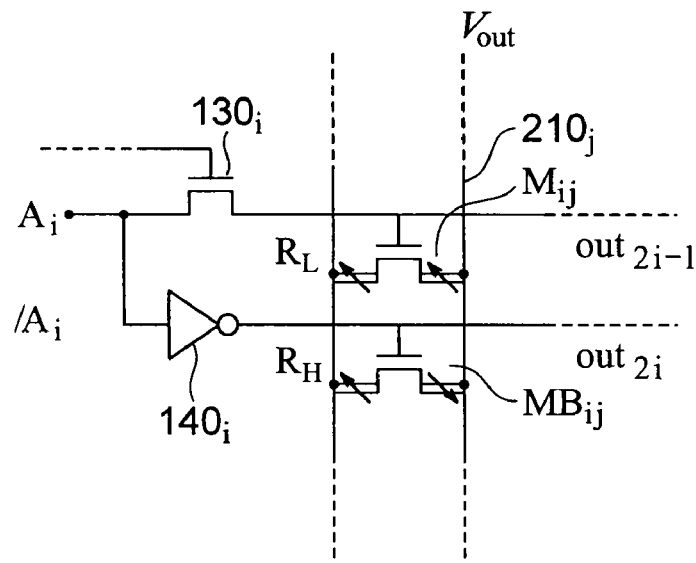
FIG. 5 is a diagram showing a unit programmable cell in the case where a storage element is a spin transistor.

Hereinafter, in the present specification, first and second spin transistors connected to the same row and the same column, for example, the first spin transistor $M_{ij}$ and the second spin transistor $MB_{ij}$ connected to the ith (i=1, ..., n) row and the jth (j=1, ..., m) column as shown in FIG. 5 are referred to as a unit programmable cell. Each spin transistor constitutes a memory circuit. In other words, the storage element array 200 has a configuration in which n×m unit programmable cells are arranged in a matrix form, and it is also referred to as programmable cell array.

Figure 6:
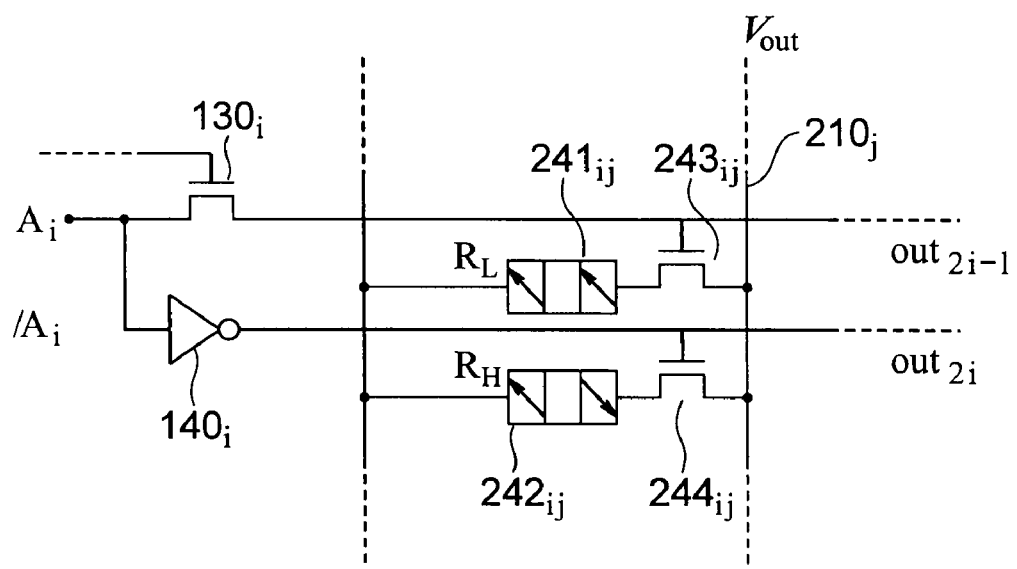
FIG. 6 is a diagram showing a unit programmable cell in the case where the storage element is an MRAM.
Figure 7:
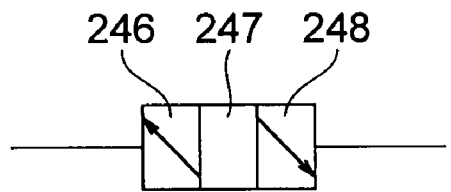
FIG. 7 is a diagram showing a specific example of the MRAM.

An arrangement in which the unit programmable cells are arranged in the column direction is referred to as a first NOR plane. As the resistance change type storage elements in the storage element array 200, two-terminal elements of resistance change type such as MRAMs (Magnetoresistive Random Access Memories) or ReRAMs (Resistance Random Access Memories) can be used instead of the spin transistors. A unit programmable cell in the case where an MRAM is used as the resistance change type storage element is shown in FIG. 6. This unit programmable cell includes first and second MRAMs $241_{ij}$ and $242_{ij}$ and MOS transistors $243_{ij}$ and $244_{ij}$ connected to the ith (i=1, ..., n) row and the jth (j=1, ..., m) column. A first end of the first MRAM $241_{ij}$ is connected to the ground, and a second end of the first MRAM $241_{ij}$ is connected to the NOR line $210_j$ via the MOS transistor $243_{ij}$. A first end of the second MRAM $242_{ij}$ is connected to the ground, and a second end of the second MRAM $242_{ij}$ is connected to the NOR line $210_j$ via the MOS transistor $244_{ij}$. In each unit programmable cell, the first MRAM $241_{ij}$ and the MOS transistor $243_{ij}$ connected to the first MRAM $241_{ij}$ in series constitute a first memory circuit, and the second MRAM $242_{ij}$ and the MOS transistor $244_{ij}$ connected to the second MRAM $242_{ij}$ in series constitute a second memory circuit. A specific example of the MRAM is shown in FIG. 7. The MRAM of the specific example includes a magnetization pinned layer 246 fixed in magnetization direction, a magnetization free layer (also referred to as magnetic storage layer) 248 which is variable in magnetization direction to store data, and a non-magnetic layer 247 provided between the magnetization pinned layer 246 and the magnetization free layer 248.

Figure 8:
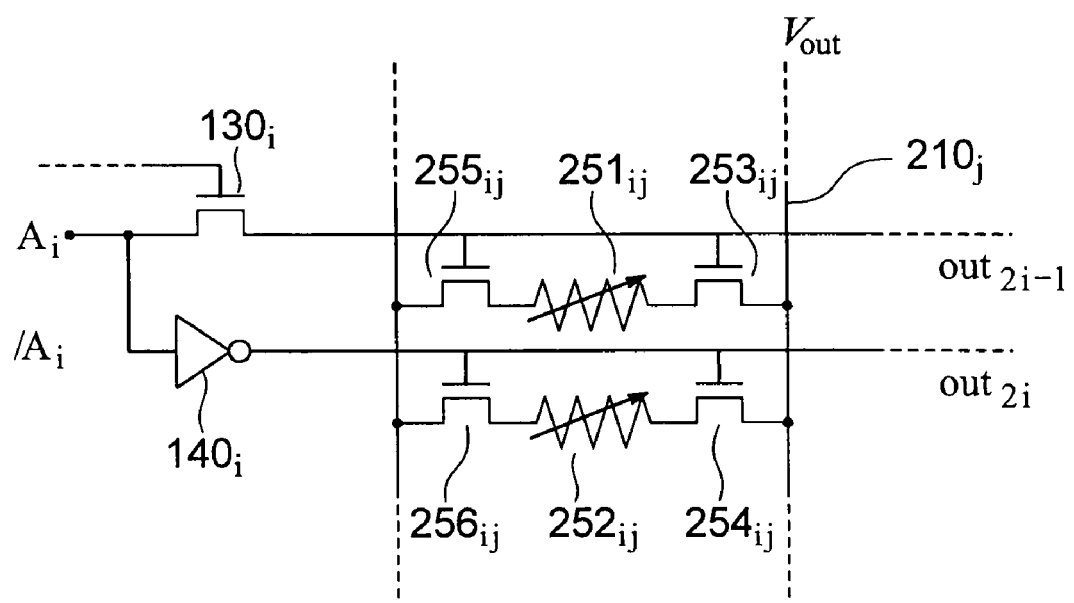
FIG. 8 is a diagram showing a unit programmable cell in the case where the storage element is a ReMRAM.

A unit programmable cell in the case where an ReRAM is used as the resistance change type storage element is shown in FIG. 8. This unit programmable cell includes first and second ReRAMs $251_{ij}$ and $252_{ij}$ and MOS transistors $253_{ij}$, $254_{ij}$, $255_{ij}$ and $256_{ij}$ connected to the ith (i=1, ..., n) row and the jth (j=1, ..., m) column. A first end of the first ReRAM $251_{ij}$ is connected to the ground via the MOS transistor $255_{ij}$ and a second end of the first ReRAM $251_{ij}$ is connected to the NOR line $210_j$ via the MOS transistor $253_{ij}$. A first end of the second ReRAM $252_{ij}$ is connected to the ground via the MOS transistor $256_{ij}$ and a second end of the second ReRAM $252_{ij}$ is connected to the NOR line $210_j$ via the MOS transistor $254_{ij}$. In each unit programmable cell, the first ReRAM $251_{ij}$ and the MOS transistors $253_{ij}$ and $255_{ij}$ connected to the first ReRAM $251_{ij}$ in series constitute a first memory circuit, and the second ReRAM $252_{ij}$ and the MOS transistors $254_{ij}$ and $256_{ij}$ connected to the second ReRAM $252_{ij}$ in series constitute a second memory circuit.

Referring back to FIG. 4, the NOR gate 300 includes m MOS transistors $310_1$ to $310_m$ connected in parallel, and a load resistor 320. This NOR gate is also referred to as second NOR plane. First ends of the MOS transistors $310_j$ (j=1, ..., m) are connected to the ground. Second ends of the MOS transistors $310_j$ are connected in common and connected to the power supply $V_{DD}$ via the load resistor 320. The MOS transistor $310_j$ is connected at its gate to the NOR line $210_j$. An output $V_{out}$ of the programmable logic circuit according to the present embodiment is obtained from the second ends of the MOS transistors $310_1$ to $310_m$ connected in common in the NOR gate 300.

Figure 9:
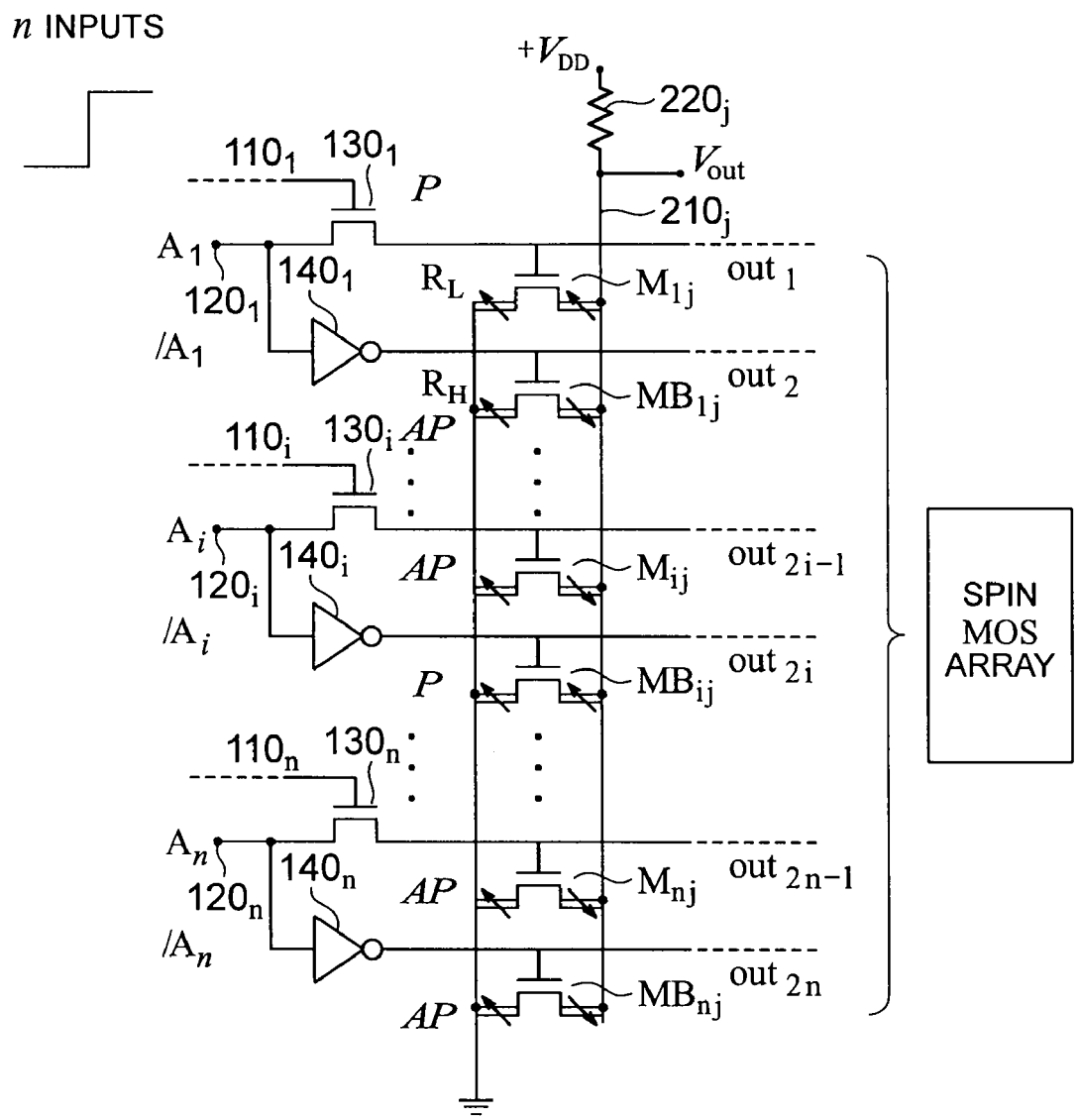
FIG. 9 is a diagram showing a spin MOS array in the case where the storage element is a spin transistor.

Spin transistors obtained by arranging unit programmable cells each having a spin transistor in the column direction are referred to as a spin MOS array as shown in FIG. 9. In other words, in a spin MOS array, the first spin transistor $M_{kj}$ (k=1, ..., n) and the second spin transistor $MB_{kj}$ in the jth (j=1, ..., m) column are connected in parallel, and first ends of them are connected to the ground and second ends of them are connected to the NOR line $210_j$. An output of the spin MOS array is output to the NOR line $210_j$, and a NOR gate is constituted. Since an AND-OR circuit is implemented by NOR-connecting two sets of NOR gates, the NOR line and the NOR plane are also referred to as AND line and AND plane.

Figure 10:
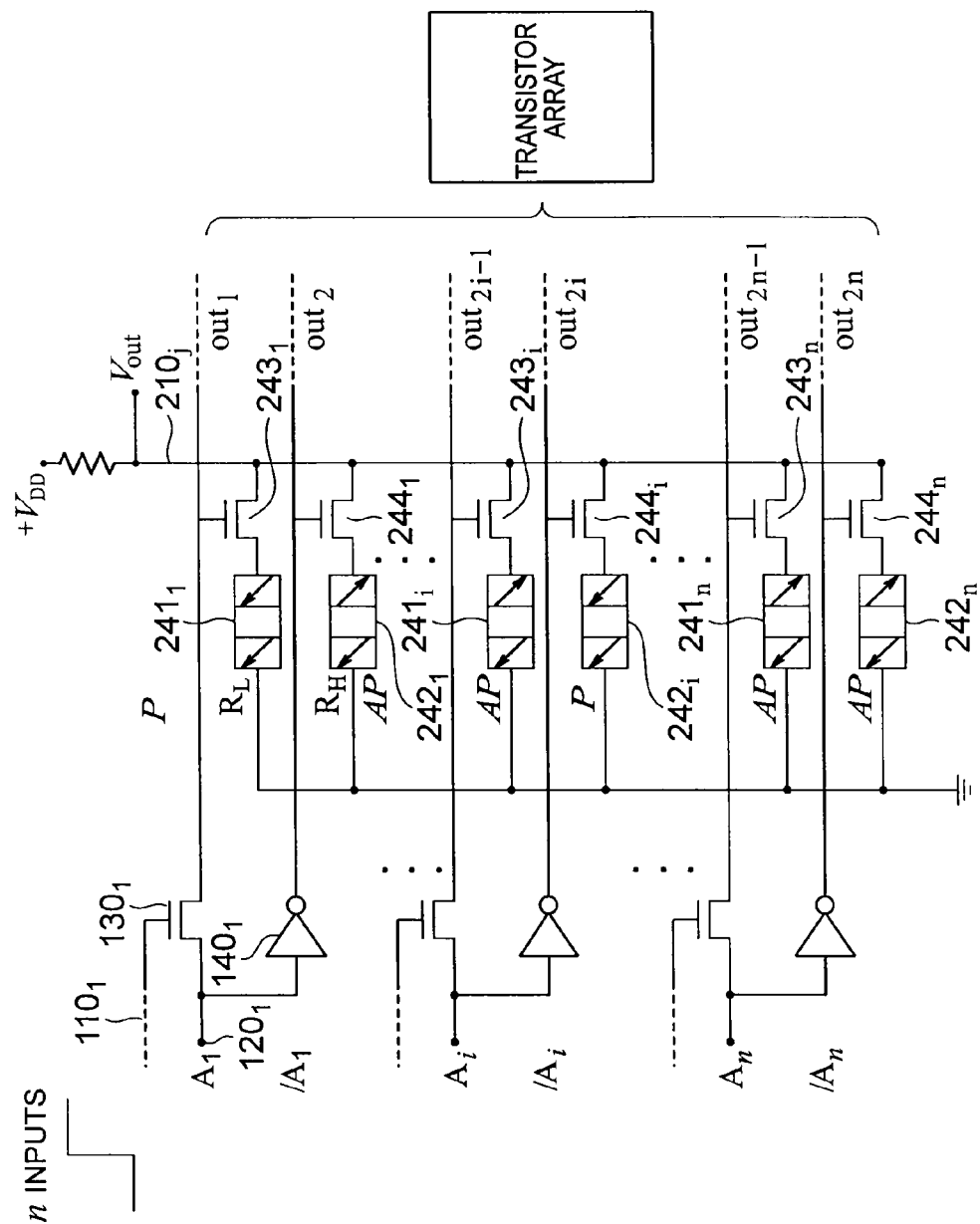
FIG. 10 is a diagram showing a spin MOS array in the case where the storage element is an MRAM.

Although FIG. 9 shows an array in which a spin transistor is used as a storage element in the unit programmable cell, an array in which an MRAM is used instead of the spin transistor is shown in FIG. 10. The array shown in FIG. 10 has a configuration obtained from that shown in FIG. 9 by replacing the unit programmable cell shown in FIG. 5 with the unit programmable cell shown in FIG. 6, and it is also referred to as transistor array.

In the present embodiment, the input signal A as it is or its inverted signal /A must be selected as each input for one NOR operation in the first NOR plane. Therefore, two spin transistors are prepared for each input signal. One spin transistor receives the input signal at its gate via the MOS transistor, and the other spin transistor receives the input signal at its gate via the inverter. For example, for the input $A_1$, the spin transistor $M_{11}$ and the spin transistor $MB_{11}$ are prepared on the AND line $210_1$, and the spin transistor $M_{12}$ and the spin transistor $MB_{12}$ are prepared on the adjacent AND line $210_2$ (see FIG. 4). Sources or drains of these spin transistors are connected to the ground, and the spin transistors are connected in parallel as shown in FIG. 4 as a result of the NOR operation. The resistance of the spin transistor changes according to the state of the magnetic domain in the spin transistor. The states of the spin transistors on one AND line appear as a voltage change on the AND line $210_1$, $210_2$ or the like.

Figure 11:
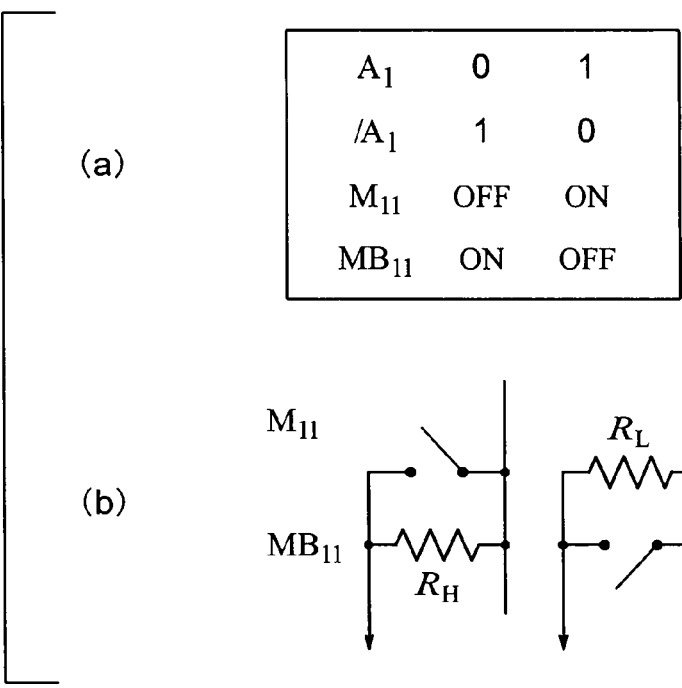
FIGS. 11(a) and 11(b) are diagrams for explaining an operation of a unit programmable cell.

FIGS. 11(a) and 11(b) are diagrams showing how the output potential of the AND line $210_j$ changes when the magnetic domain state of a spin transistor has changed with respect to a change of the input signal $A_1$. It is assumed that the spin transistor $M_{11}$, which receives the input signal $A_1$ via the MOS transistor $130_1$ at its gate, is in the low resistance state. If the input signal $A_1$ changes from 0 to 1, i.e., if a voltage applied to the gate of the spin transistor $M_{11}$ changes from a low voltage to a high voltage, then a current flows between the source and drain of the spin transistor $M_{11}$ and the channel changes from OFF to ON. At this time, the resistance of the spin transistor $M_{11}$ changes from infinitely great (OFF state) to $R_L$ (ON state) (see FIG. 11(b)). On the other hand, an inverted signal /A is input to the gate of the other spin transistor $MB_{11}$ connected via the inverter $140_1$. Therefore, the spin transistor $MB_{11}$ changes from ON to OFF (see FIG. 11(b)). When the spin transistor $MB_{11}$ is regarded as a resistor, its resistance changes from $R_H$ (ON) to infinitely great (OFF). Since the two spin transistors are connected in parallel to the AND line $210_j$, it is appreciated that a change caused on the AND line by the two spin transistors in response to the input signal is $$R_H \to R_L$$

i.e., from the high resistance to the low resistance.

Figure 12:
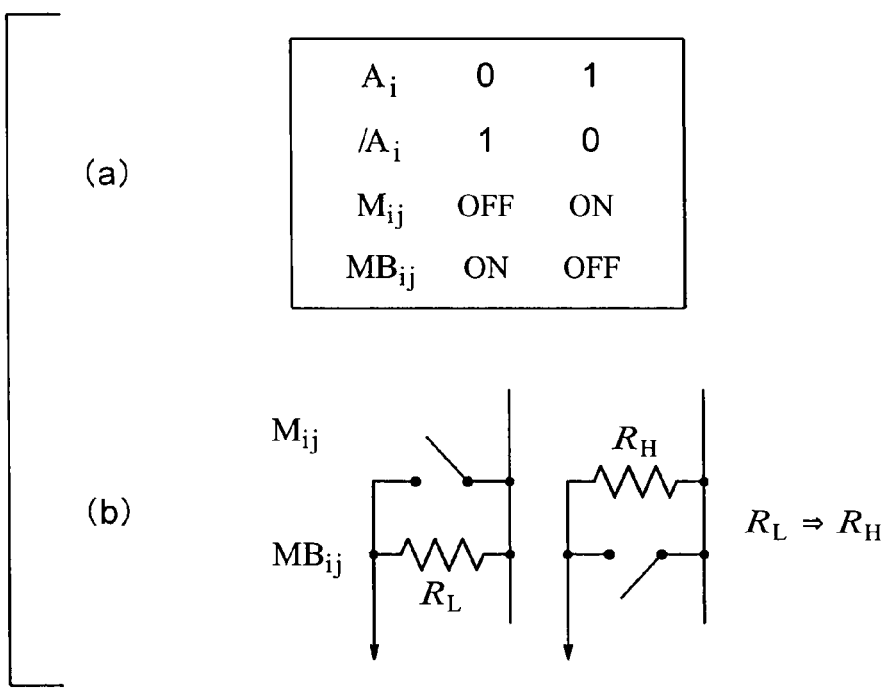
FIGS. 12(a) and 12(b) are diagrams for explaining an operation of a unit programmable cell.

In the same way, if the spin transistor $M_{ij}$ which receives the input signal $A_i$ via the MOS transistor at its gate is in the high resistance state and the spin transistor $MB_{ij}$ which receives the input signal $A_i$ via the inverter $140_i$ is in the low resistance state as shown in FIGS. 12(a) and 12(b), it is appreciated that a resistance change caused on the AND line $210_j$ by the two spin transistors $M_{ij}$ and $MB_{ij}$ becomes as follows:

$$R_L \to R_H$$

If both magnetization directions of two spin transistors $M_{nj}$ and $MB_{nj}$ which receive an input signal $A_n$ are in the high resistance state as shown in FIG. 9, then it is appreciated that a resistance change caused on the AND line $210_j$ by the two spin transistors $M_{nj}$ and $MB_{nj}$ is $$R_H \to R_H$$

and there is no change. When the value of the input signal $A_1$ has changed from 0 to 1, the value of the inverted input signal /$A_1$ changes from 1 to 0 as shown in FIG. 11(a). Combinations of the spin transistors $M_{11}$ and $MB_{11}$ are shown by representing the ON state of a transistor by resistance. The left side represents an effect on the AND line $210_j$ obtained when the value of the input signal $A_1$ is 0. The right side represents an effect on the AND line $210_j$ obtained when the value of the input signal $A_1$ is 1. FIG. 12(a) shows state changes of the spin transistors $M_{ij}$ and $MB_{ij}$ shown in FIG. 9.

Figure 13:
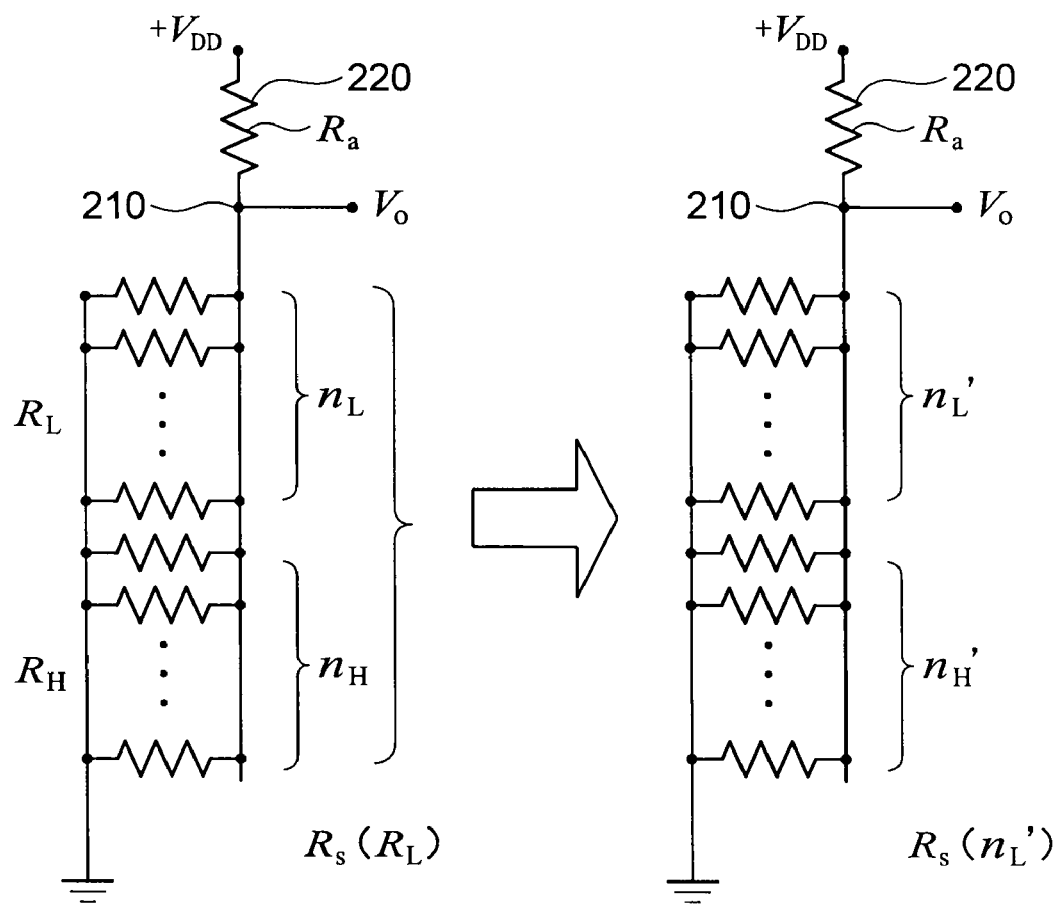
FIG. 13 is a diagram for explaining a change of an output with respect to an input of a spin MOS array.

It is appreciated that an effect exerted upon one AND line by changes of n inputs is equivalent to a change of resistances of n resistors connected in parallel as shown in FIG. 13. Denoting the number of low-resistance resistors by $n_L$ and the number of high-resistance resistors by $n_H$, this distribution changes in response to a change of the input signals. Since two spin transistors are in the high resistance state for an input which is not used, it is appreciated that the following expression holds true between $n_L$ and $n_H$.

$$n_L + n_H = 2n \tag{2}$$

Considering that the spin transistors are in parallel, therefore, all resistance on the spin transistor line is represented by the following expression.

$$\frac{1}{R_s(n_L)} = \frac{n_L}{R_L} + \frac{n_H}{R_H} \quad (3)$$

Denoting a resistance of the whole of the spin transistors by $R_s(n_L)$, a potential $V_{out}(n_L)$ on an AND line 210 shown in FIG. 13 is represented by the following expression.

$$V_{out}(n_L) = \frac{R_s(n_L)}{R_s(n_L) + R_a} V_{DD} \quad (4)$$

Here, $R_a$ denotes a resistance value of a load resistor 220, and $V_{DD}$ denotes a power supply voltage. On the basis of these relational expressions, NOR gates of the following two kinds can be constructed as logical operation of the spin MOS array:

(1) a NOR gate in which a transistor on a second NOR plane (NOR gate 300) turns on if any one of spin transistors is low in resistance; and (2) a NOR gate in which a transistor on a second NOR plane (NOR gate 300) turns on if any one of spin transistors is high in resistance.

Hereinafter, the two cases will be described.

Implementation Method of NOR Gate (1)

First, the case of (1), i.e., the case where a transistor on the second NOR plane (the NOR gate 300) turns on if any one of spin transistors is low in resistance will now be described with reference to FIGS. 14(a) and 14(b).

If the following relational expression is satisfied, i.e., the number $n_L$ is at least one in this case, then a transistor 310$_j$ on the second NOR plane (the NOR gate 300) turns on.

$$V_{out}(n_L=1) < V_{th} < V_{out}(n_L=0) \quad (5)$$

Here, $V_{th}$ denotes a threshold voltage of the transistor 310$_j$. Substituting Expression (4) into Expression (5) and rearranging by using Expressions (2) and (3), Expression (5) is rewritten as in Expression (6).

$$\frac{R_a}{R_H} N < \alpha < \frac{R_a}{R_H}(N-1) + \frac{R_a}{R_L} \quad (6)$$

The relation represented by Expression (6) should be satisfied between resistance $R_H$ in the high resistance state of a spin transistor and resistance $R_L$ in the low resistance state. Here, N=2n, and α is a parameter which represents characteristics of a transistor on the NOR plane, and α is defined as $$\alpha = (V_{DD} - V_{th})/V_{th} \quad (7)$$

For example, therefore, it follows that α=4 when $V_{DD}$=1.5 V and $V_{th}$=0.3 V, and α=3.8 when $V_{DD}$=1.2 V and $V_{th}$=0.25 V. From Expression (6), the high resistance state and the low resistance state of the spin transistor should satisfy the following conditions.

$$R_L < \frac{R_H R_a}{\alpha R_H - (N-1)R_a}, \frac{N}{\alpha} R_a < R_H \quad (8)$$

Figure 14:
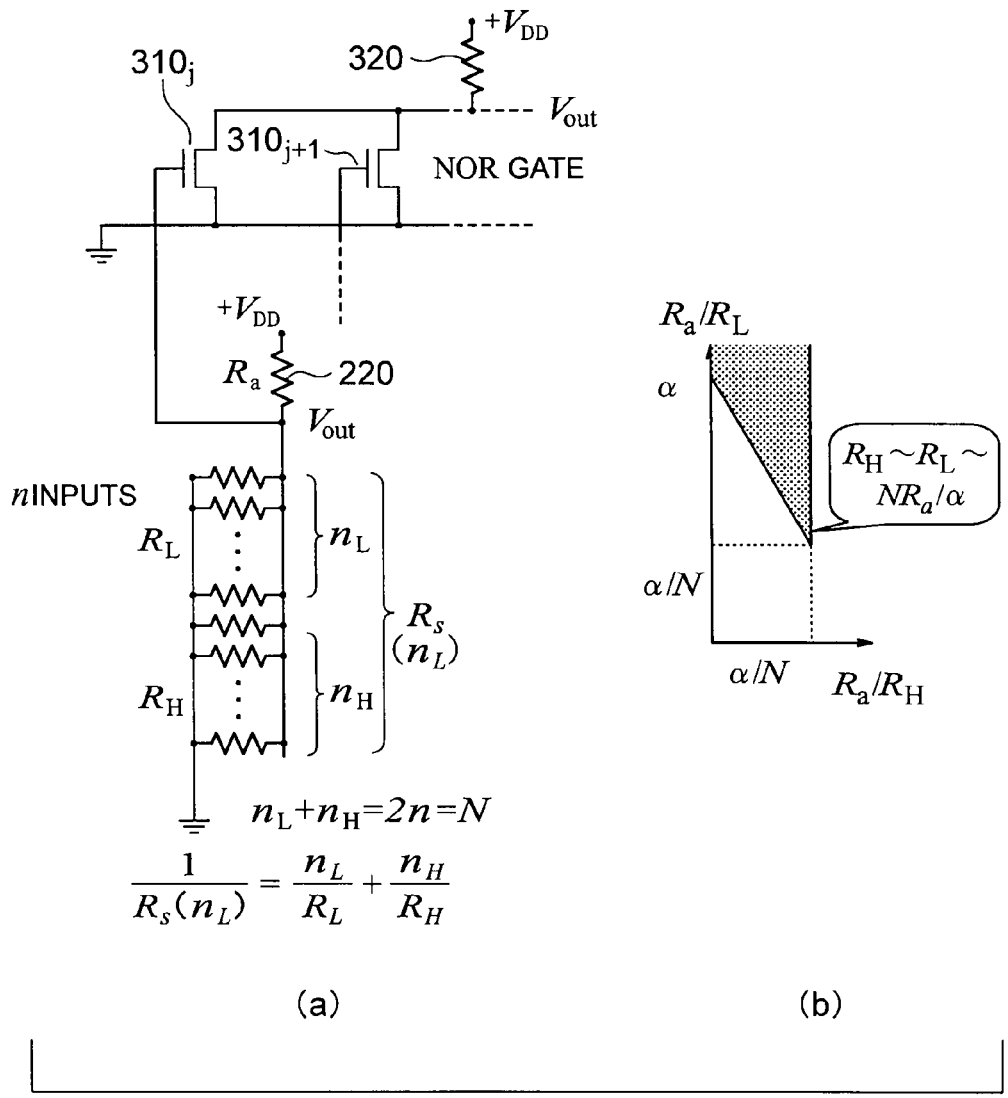
FIGS. 14(a) and 14(b) are diagrams for explaining a case where a transistor on a second NOR plane turns on if a spin transistor in a low resistance state exists.

Representing $R_a/R_H$ on the x-axis and $R_a/R_L$ on the y-axis, the conditions become as shown in FIG. 14(b). For example, if an array of N=32 is used when the channel length of the transistor is 50 nm, the channel width is 500 nm, $V_{DD}$=1.2 V, $V_{th}$=0.25 V, $R_L$=3 kΩ, $R_H$=$R_L$ (1+MR) and MR=9, it follows that a resistor having a resistance value $R_a$ represented as $R_a$=57×(1/N+1/(N+9))=3.2 kΩ should be used as the load resistor 220. As appreciated from FIG. 14(b), the above-described operation can be implemented even in a region where $R_H$ and $R_L$ are close to each other as appreciated from FIG. 14(b). In other words, the present embodiment has an advantage that the NOR gate can be formed of even spin transistors having a low MR ratio.

Implementation Method of NOR Gate (2)

A NOR gate in which a transistor on the second NOR plane (the NOR gate 300) turns on if any one of spin transistors is high in resistance will now be described with reference to FIGS. 15(a) and 15(b).

The implementation method of NOR gate (1) shows the condition that the transistor on the second NOR plane turns on if at least one of the spin transistors on the first NOR plane is low in resistance. This can lead to a condition that the transistor on the second NOR plane turns on if at least one spin transistors on the first NOR plane is high in resistance. In this case, both states of two spin transistors in a pair, which does not concern the logical operation, are kept in the low resistance state. Thereupon, Expression (9) should hold true instead of Expression (5).

$$V_{out}(n_L=N) < V_{th} < V_{out}(n_L=N-1) \quad (9)$$

When Expression (9) is rewritten by substituting thereinto Expression (4), Expression (3) and Expression (2), the following expression is obtained.

$$\frac{R_a}{R_L}(N-1) + \frac{R_a}{R_H} < \alpha < \frac{R_a}{R_L} N \quad (10)$$

Therefore, the following expression becomes a condition where the high resistance state and the low resistance state of spin transistors should satisfy.

$$R_L < \frac{N}{\alpha} R_a, \frac{R_L R_a}{\alpha R_L - (N-1)R_a} < R_H \quad (11)$$

Figure 15:
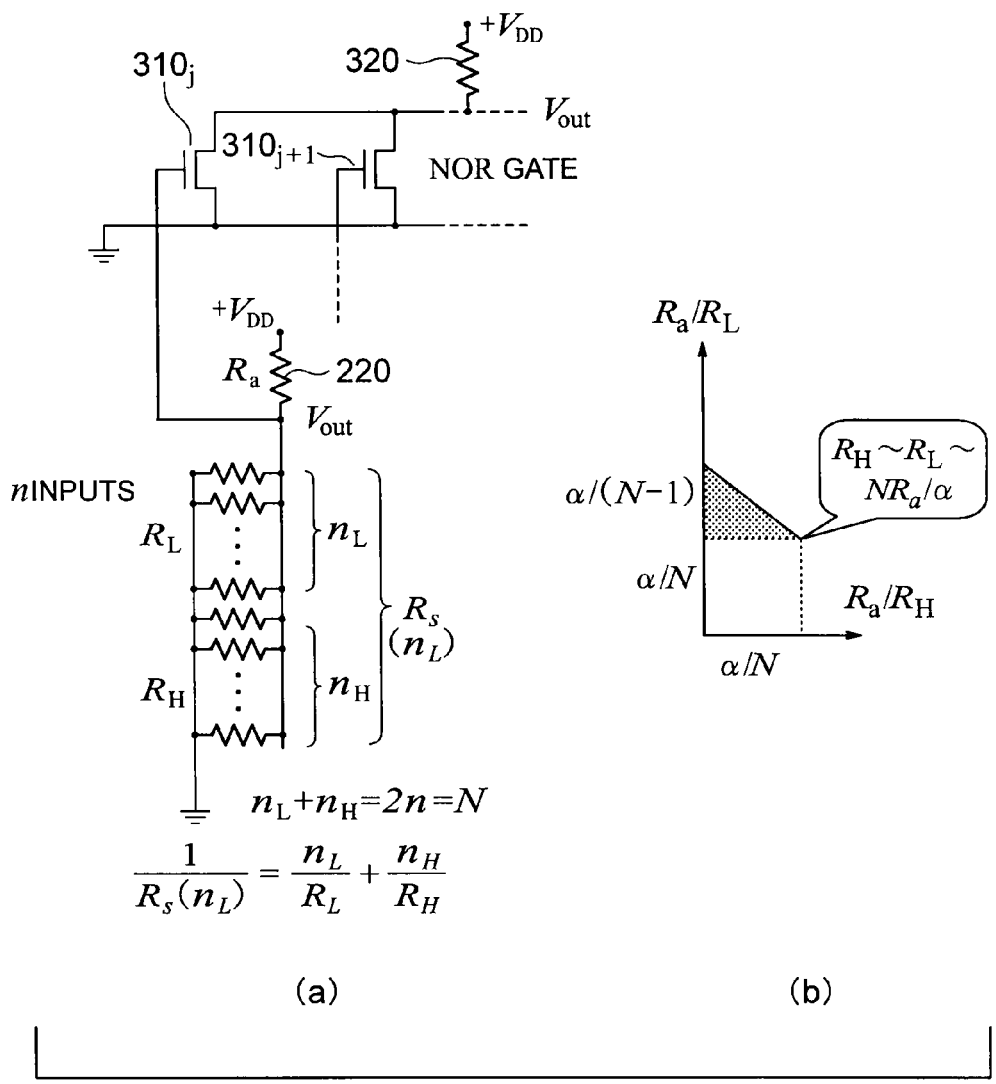
FIGS. 15(a) and 15(b) are diagrams for explaining a case where a transistor on a second NOR plane turns on if a spin transistor in a high resistance state exists.

Representing $R_a/R_H$ on the x-axis and $R_a/R_L$ on the y-axis, the conditions become as shown in FIG. 15(b). As appreciated from FIG. 15(b), the implementation method of the NOR gate (2) is relational expressions which hold true in a range narrower than that for the implementation method of the NOR gate (1) shown in FIG. 14(b). It is appreciated that the above-described operation can be implemented in a region where $R_H$ is close to $R_L$ in the implementation method of the NOR gate (2) shown in FIG. 15(b) as well. In other words, the present embodiment has a feature that the NOR gate can be formed of even spin transistors having a low MR ratio.

The resistance value $R_a$ of the load resistor 220 can also be implemented by using at least one ordinary MOSFETs so as to be able to change characteristics of spin transistors on each AND line. For example, from Expression (11), a small $R_a$ is needed in many cases when N is great. At this time, adjustment can be made by using at least two ordinary MOSFETs. Furthermore, in this case, it becomes possible to adjust dispersion of performance of spin transistors after manufacturing.

According to the present embodiment, spin transistors are used as storage elements as heretofore described. Therefore, it is possible to suppress the influence upon writing and retaining characteristics as far as possible and prevent software errors from occurring even if the storage elements are made fine.

Second Embodiment

Figure 16:
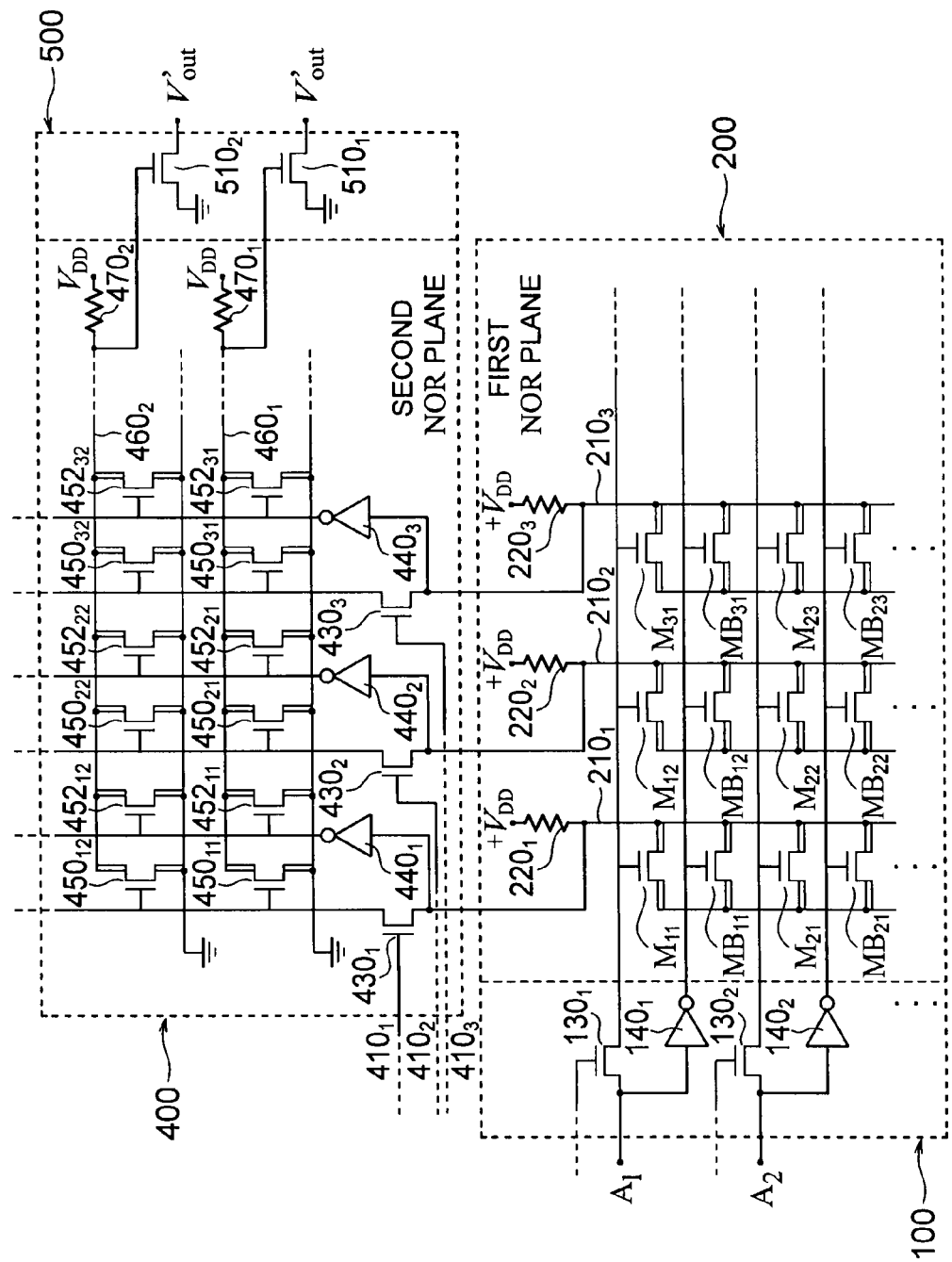
FIG. 16 is a circuit diagram showing a programmable logic circuit according to a second embodiment.

A programmable logic circuit according to a second embodiment is shown in FIG. 16. The programmable logic circuit according to the present embodiment has a configuration obtained by replacing the second NOR plane 300 shown in FIG. 4 with a second NOR plane 400 formed of a spin MOS array and newly providing an output circuit 500. By the way, the first NOR plane 200 has the same configuration as the first NOR plane 200 shown in FIG. 4.

The second NOR plane 400 includes a plurality of MOS transistors $430_1$, $430_2$, $430_3$, ..., inverters $440_1$, $440_2$, $440_3$, ..., provided in association with these MOS transistors, first spin transistors $450_{ij}$ (i=1, ..., j=1, ...) arranged in a matrix form, second spin transistors $452_{ij}$ (i=1, ..., j=1, ...) arranged in a matrix form, NOR lines $460_j$ (j=1, ...), and load resistors $470_j$ (j=1, ...). The load resistors can be formed of transistors.

The MOS transistors $430_i$ (i=1, ...) are connected at their first ends to NOR lines $210_i$ on the first NOR plane 200, and connected at their second ends to gates of the first spin transistors $450_{i1}$, $450_{i2}$, ... on the ith row. The MOS transistors $430_i$ (i=1, ...) receive control signals $410_i$ at their gates. The inverters $440_i$ (i=1, ...) receive the control signals $410_i$, and send their inverted signals to respective gates of the second spin transistors $452_{i1}$, $452_{i2}$, ... on the ith row.

The first and second spin transistors $450_{1j}$, $452_{1j}$, $450_{2j}$, ... on the jth column are connected in parallel, connected at their first ends to the ground, and connected at their ends to the NOR line $460_j$. Each NOR line $460_j$ (j=1, ...) is connected to the power supply $V_{DD}$ via a load resistor $470_j$.

The output circuit 500 includes MOS transistors $510_j$ provided in association with the NOR line $460_j$ (j=1, ...). The MOS transistor $510_j$ is connected at its gate to the associated NOR line $460_j$, and connected at its source to the ground. A plurality of outputs V'out of the programmable logic circuit according to the present embodiment are output from drains of the MOS transistors $510_j$.

In the programmable logic circuit according to the present embodiment, the second NOR plane 400 can select outputs of several kinds from outputs of the first NOR plane 200. The second NOR plane 400 can be connected to another NOR plane. Effects of the spin transistors on the second NOR plane 400 are the same as those described with reference to FIGS. 9, 11 and 12. Only three inputs and only two outputs are shown in FIG. 16. However, these numbers are not restrictive.

According to the present embodiment, spin transistors are used as storage elements as heretofore described. Therefore, it is possible to suppress the influence upon writing and retaining characteristics as far as possible and prevent software errors from occurring even if the storage elements are made fine.

In the foregoing description, the PLA structure has been mainly described. The second NOR plane on the output side can be applied to a fixed PAL (Programmable Array Logic) structure as well.

Third Embodiment

Figure 18:
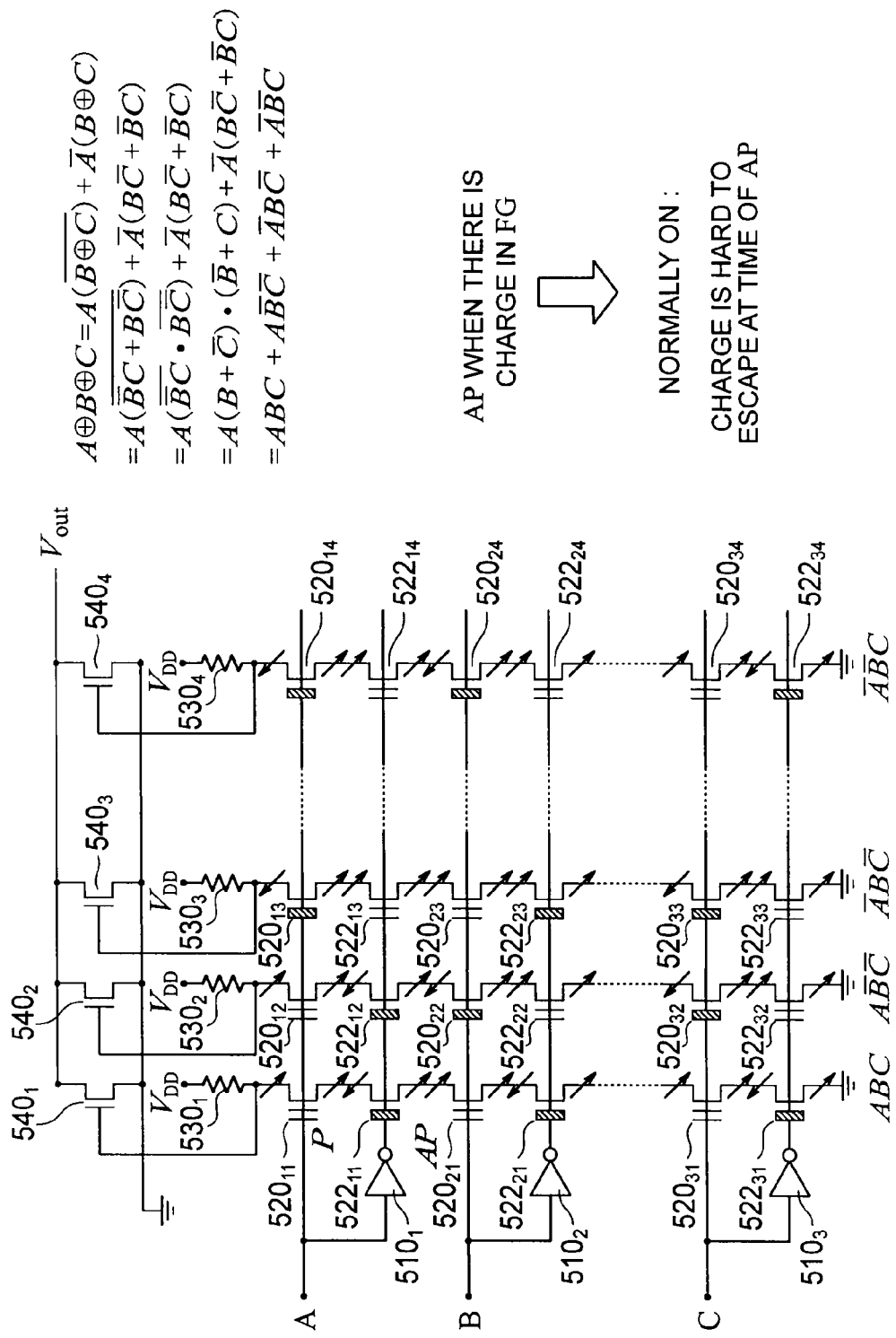
FIG. 18 is a circuit diagram showing a programmable logic circuit according to a third embodiment.

A programmable logic circuit according to a third embodiment of the present invention is shown in FIG. 18. The programmable logic circuit includes inverters $510_1$ to $510_3$, first spin transistors $520_{11}$ to $520_{34}$ having floating gates (hereinafter, also referred to as FG) and arranged in a matrix form, second spin transistors $522_{11}$ to $522_{34}$ having FGs and arranged in a matrix form, load resistors $530_1$ to $530_4$, and MOS transistors $540_1$ to $540_4$. Spin transistors $520_{1j}$, $522_{1j}$, $520_{2j}$, $522_{2j}$, $520_{3j}$, and $522_{3j}$ on the jth (j=1, 2, 3, 4) column constitute a series circuit in which the spin transistors are connected in series in the cited order. A first end of the series circuit is connected to the power supply $V_{DD}$ via the load resistor $530_j$ and connected to the MOS transistor $540_j$ at its gate, and a second end of the series circuit is connected to the ground.

The first spin transistors $520_{11}$, $520_{12}$, $520_{13}$ and $520_{14}$ on a first row are connected in common at their gates to receive an input signal A. The second spin transistors $522_{11}$, $522_{12}$, $522_{13}$ and $522_{14}$ on the first row are connected in common at their gates to receive an inverted signal /A of the input signal A inverted by the inverter $510_1$.

The first spin transistors $520_{21}$, $520_{22}$, $520_{23}$ and $520_{24}$ on a second row are connected in common at their gates to receive an input signal B. The second spin transistors $522_{21}$, $522_{22}$, $522_{23}$ and $522_{24}$ on the second row are connected in common at their gates to receive an inverted signal /B of the input signal B inverted by the inverter $510_2$.

The first spin transistors $520_{31}$, $520_{32}$, $520_{33}$ and $520_{34}$ on a third row are connected in common at their gates to receive an input signal C. The second spin transistors $522_{31}$, $522_{32}$, $522_{33}$ and $522_{34}$ on the third row are connected in common at their gates to receive an inverted signal /C of the input signal C inverted by the inverter $510_3$.

The MOS transistors $540_1$ to $540_4$ are connected in parallel. First ends of the MOS transistors $540_1$ to $540_4$ are connected to the ground. Second ends of the MOS transistors $540_1$ to $540_4$ are connected in common. An output $V_{out}$ of the programmable logic circuit according to the present embodiment is obtained from the second ends connected in common.

The first and second spin transistors in the present embodiment has a configuration obtained by replacing the gate 10 of the spin transistor shown in FIGS. 1A and 1B with a gate having a laminated structure which is obtained by laminating a floating gate (FG), an inter-electrode insulation film and a control gate in the cited order. When the FG has charge stored therein, the spin transistor is in the high resistance state. In the case of a transistor in which the high resistance state is attained when the spin direction in the ferromagnetic material structure in the source electrode is antiparallel to that in the drain electrode, the spin direction of the ferromagnetic layer located nearest the substrate in the ferromagnetic material structure in the source electrode is antiparallel to the spin direction of the ferromagnetic layer located nearest the substrate in the ferromagnetic material structure in the drain electrode. For example, as shown in FIG. 2A, the spin direction in the magnetization pinned layer 17a in the source electrode 14a is antiparallel to the spin direction in the magnetization free layer 15 in the drain electrode 14b. In FIG. 18, gates of the first and second spin transistors, which are in the high resistance state, are shaded. In other words, since the spin transistors $520_{13}$, $520_{14}$, $522_{11}$, $522_{12}$, $520_{22}$, $520_{24}$, $522_{21}$, $522_{23}$, $520_{32}$, $520_{33}$, $522_{31}$ and $522_{34}$ in FIG. 18 are in the high resistance state, their gates are shaded. Other spin transistors are in the low resistance state.

As shown in FIG. 18, spin directions of the first and second spin transistors are programmed. As a result, a logical product of the signals A, B and C appears at the gate of the MOS transistor $540_1$, a logical product of the signals A, /B and /C appears at the gate of the MOS transistor $540_2$, a logical product of the signals /A, B and /C appears at the gate of the MOS transistor $540_3$, and a logical product of the signals /A, /B and C appears at the gate of the MOS transistor $540_4$. When the programmable logic circuit according to the present embodiment is programmed as shown in FIG. 18, therefore, the output $V_{out}$ becomes an exclusive OR of the input signals A, B and C.

Even if charge in the FG leaks when a spin transistor in the present embodiment is in the high resistance, the ferromagnetic material in the source electrode and the drain electrode brings about an effect that charge which has leaked from the FG is hard to flow to the source electrode and the drain electrode. In other words, in the FG type spin transistors, it becomes possible to extend the retention time.

In the present embodiment, spin transistors are connected in series. Even in a configuration obtained by replacing the spin transistors in the programmable logic circuit shown in FIG. 4 with FG type spin transistors, it also becomes possible to extend the retention time.

According to the present embodiment, spin transistors are used as storage elements as heretofore described. Therefore, it is possible to suppress the influence upon writing and retaining characteristics as far as possible and prevent software errors from occurring even if the storage elements are made fine.

Figure 19:
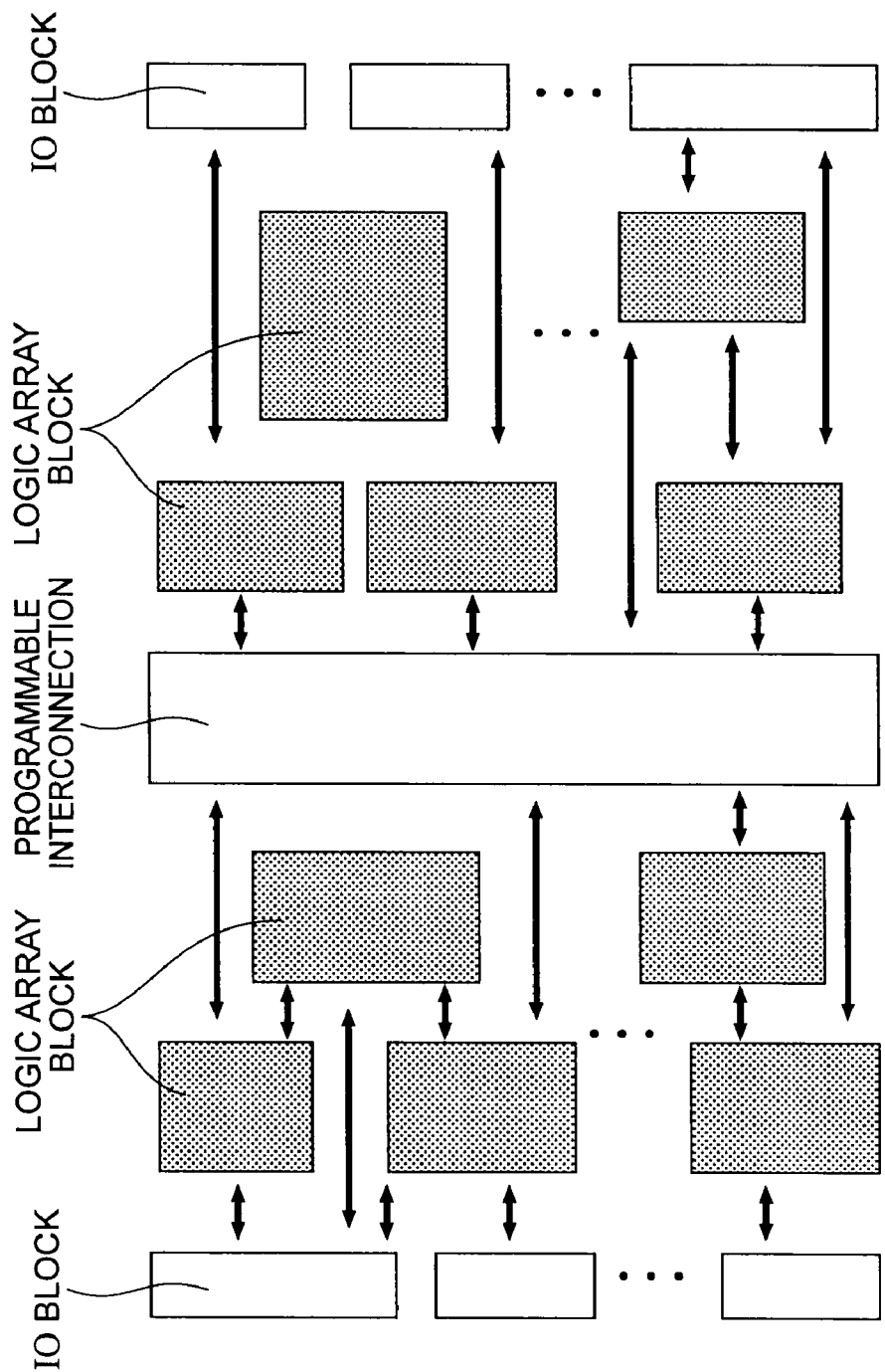
FIG. 19 is a block diagram showing a common architecture using a logic array structure.

A general architecture using a logic array structure according to an embodiment of the present invention is shown in FIG. 19. In this architecture, logic array blocks according to an embodiment of the present invention, IO blocks, and programmable interconnect wires or a bus line are connected. Arrows indicate that blocks are connected by wires. By the way, FIG. 19 does not reflect relative sizes of actual blocks, but blocks are changed according to use of products.

Figure 20:
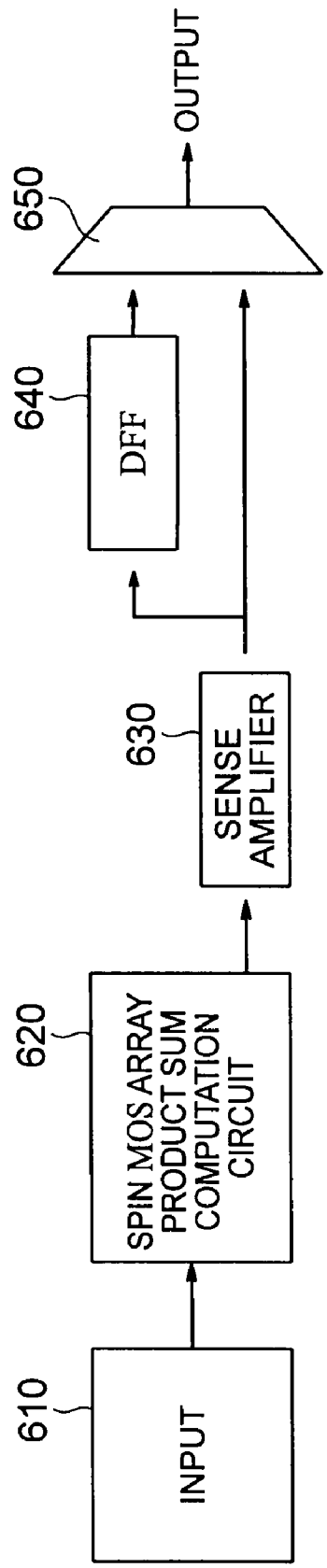
FIG. 20 is a block diagram obtained when an AND logic and an OR logic including spin transistors perform logical operations.

A block diagram obtained when AND logics and OR logics including spin transistors perform logical operation is shown in FIG. 20. An output of a routing wire is input to a logic block via an input block 610. An output signal of the input block is input to a spin MOS array product sum computation circuit block 620. The spin MOS array product sum computation circuit block 620 performs product sum computation on the input signal. A result of the computation is output to a sense amplifier 630 and converted to a digital signal. An output of the sense amplifier 630 is input directly to a multiplexer 650 or input to the multiplexer 650 via a D-type flip-flop 640. The multiplexer 650 outputs a signal from the D-type flip-flop 640 or a signal from the sense amplifier 630.

Figure 21:
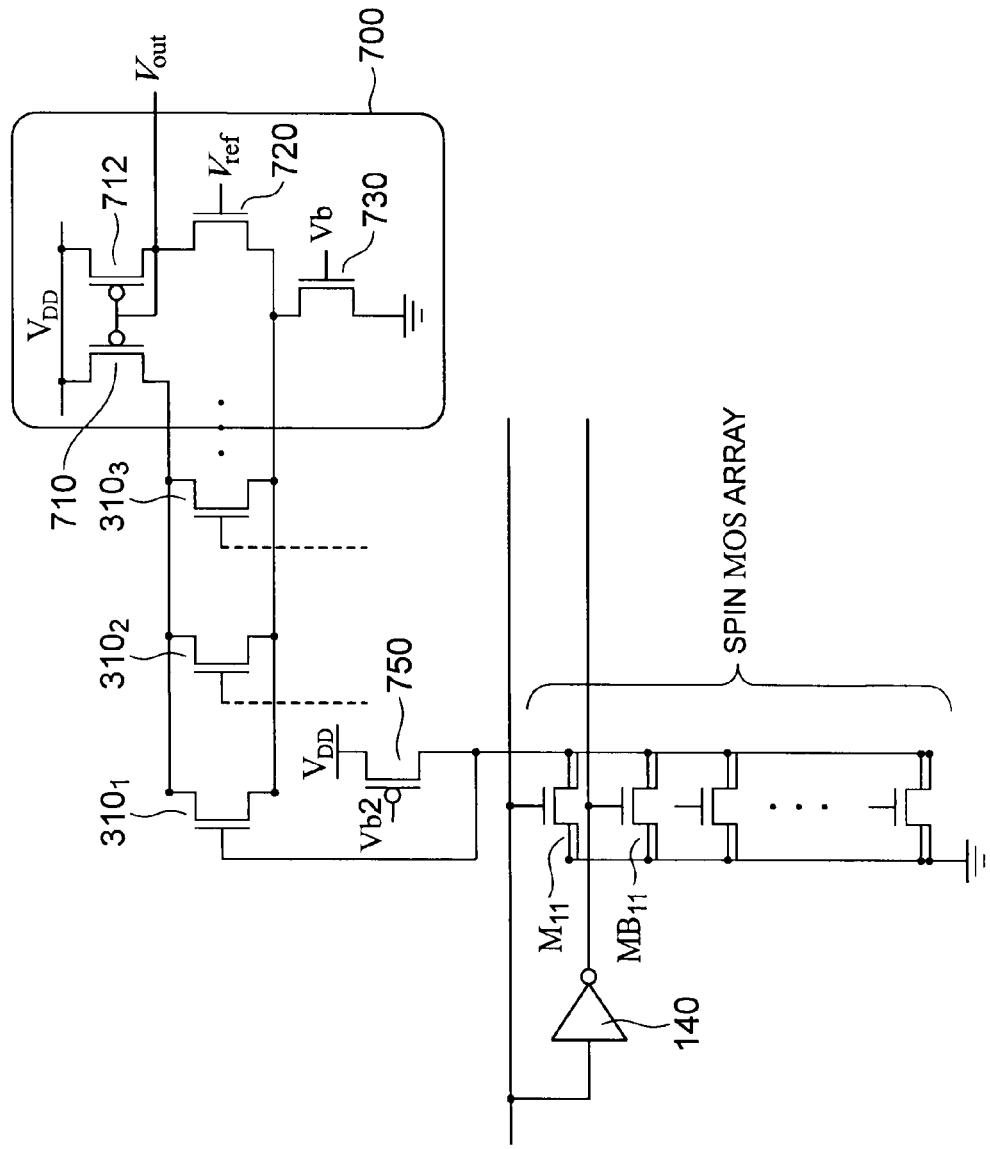
FIG. 21 is a circuit diagram obtained when a sense amplifier circuit is added to the programmable logic circuit according to the first embodiment.

A circuit obtained by adding a sense amplifier 700 to the programmable logic circuit according to the first embodiment shown in FIG. 4 is shown in FIG. 21. By the way, in FIG. 21, the load resistor of the spin MOS array is replaced by a pMOSFET 750. By using the pMOSFET, the amplitude of the output potential of the NOR logic can be made large. Furthermore, the area can be made small as compared with the resistor.

The sense amplifier 700 includes pMOSFETs 710 and 712 and nMOSFETs 720 and 730. Sources of the pMOSFETs 710 and 712 are connected to the power supply $V_{DD}$, and gates of the pMOSFETs 710 and 712 are connected in common and connected to the pMOSFET 712 at its drain. The pMOSFET 710 is connected at its drain to a node to which first ends of MOS transistors $310_1$, $310_2$, $310_3$, . . . on the second NOR plane are connected in common. The nMOSFET 720 is connected at its drain to the drain of the pMOSFET 712, and connected at its source to a drain of the nMOSFET 730. The nMOSFET 720 receives a control signal Vref at its gate. The drain of the nMOSFET 730 is connected to a node to which second ends of the MOS transistors $310_1$, $310_2$, $310_3$, . . . on the second NOR plane are connected in common. The nMOSFET 730 is connected at its source to the ground. The nMOSFET 730 receives a control signal Vb at its gate. A circuit output $V_{out}$ is output from the drain of the nMOSFET 720. In other words, the sense amplifier 700 amplifies the output of the second NOR plane, and outputs the amplified output from the drain of the nMOSFET 720. Design is simplified if a channel width $W_{10}$ of the nMOSFET 720 is made to satisfy the relation $$W_{10} = N \times W_{OR}$$

where $W_{OR}$ is a channel width of the MOS transistors $310_1$, $310_2$, $310_3$, . . . included in the OR logic (NOR logic) and N is the degree of parallelism of the OR logic (the number of the MOS transistors $310_1$, $310_2$, $310_3$, . . . connected in parallel). At that time, the voltage Vref applied to the gate of the nMOSFET 720 is made equal to the output potential of the NOR logic.

Writing Operation into Spin Transistors (Programming)

Writing operation into the spin transistors (programming) will now be described. There are several methods to write into the spin transistors. Here, a method of utilizing the spin torque interaction will be described. As described above, the magnetization direction of the magnetization free layer 15 on the drain region 5b can be changed by letting flow a large current between the source electrode 14a and the drain electrode 14b. The writing method will now be described by taking signal lines including the NOR line $210_1$ shown in FIG. 4 as an example.

For changing magnetization states of the first spin transistors $M_{11}$, $M_{21}$, . . . , $M_{n1}$ which are not connected directly to the inverters $140_1$ to $140_n$, the MOS transistors $130_1$, $130_2$, . . . , $130_n$ are turned on in order. If the signals $A_1$, $A_2$, . . . , $A_n$ are brought into the state "1" and then a large current is let flow through the NOR line $210_1$, then the magnetization direction of the magnetization free layer 15 in each spin transistor changes. For changing the magnetization free layer of each of the spin transistors $MB_{11}$, $MB_{21}$, . . . , $MB_{n1}$, all of the transistors $130_1$, $130_2$, . . . , $130_n$ are turned off, the signals $A_1$, $A_2$, . . . , $A_n$ are brought into the state "0" and then a large current is let flow through the NOR line $210_1$. All spin transistors can be programmed by the operation heretofore described.

Alternatively, it is also possible to dispose a current wire near the magnetization free layer and change the magnetization free layer by using a magnetic field generated by the current wire. In the spin transistor shown in FIGS. 1A and 1B, an example in which the magnetization free layer is provided on the drain side is described. Alternatively, the magnetization free layer may be provided on the source side, or another spin transistor as disclosed in JP-A No. 2008-66596 (KOKAI) applied for a Patent by the present applicant may be used.

Figure 22:
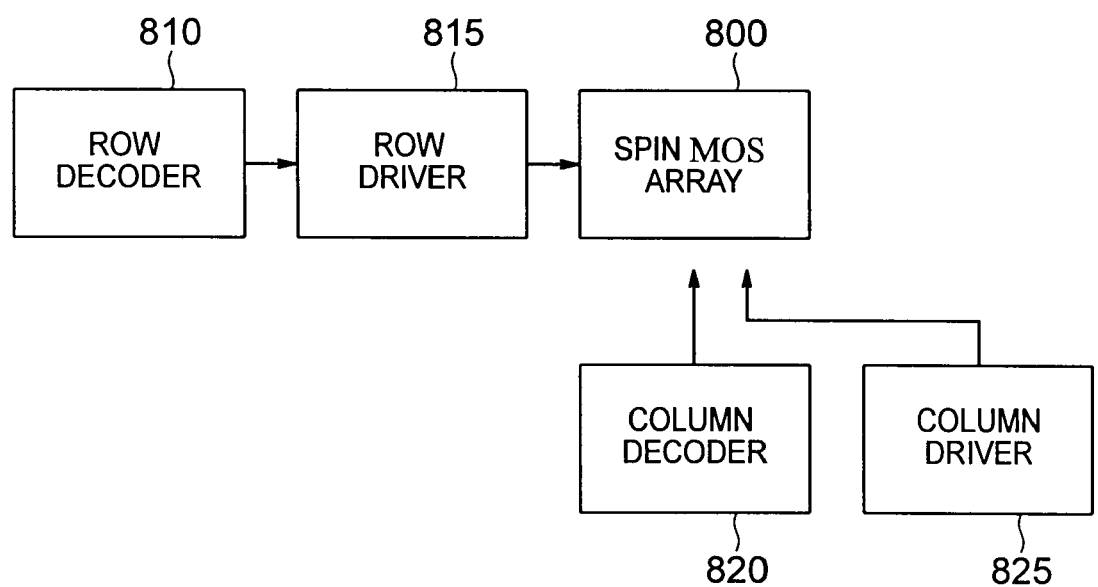
FIG. 22 is a block diagram for explaining an operation conducted when programming a spin MOS array.

A block diagram for explaining an operation conducted when programming the spin MOS array is shown in FIG. 22. A spin transistor to be programmed in a spin MOS array 800 is selected by a row decoder 810 and a column decoder 820. An output of the row decoder 810 is input to a row driver 815. The row driver 815 is a circuit which outputs a gate voltage for programming a spin transistor. By the way, a drain voltage for programming a spin transistor is given by a column driver 825.

Figure 23:
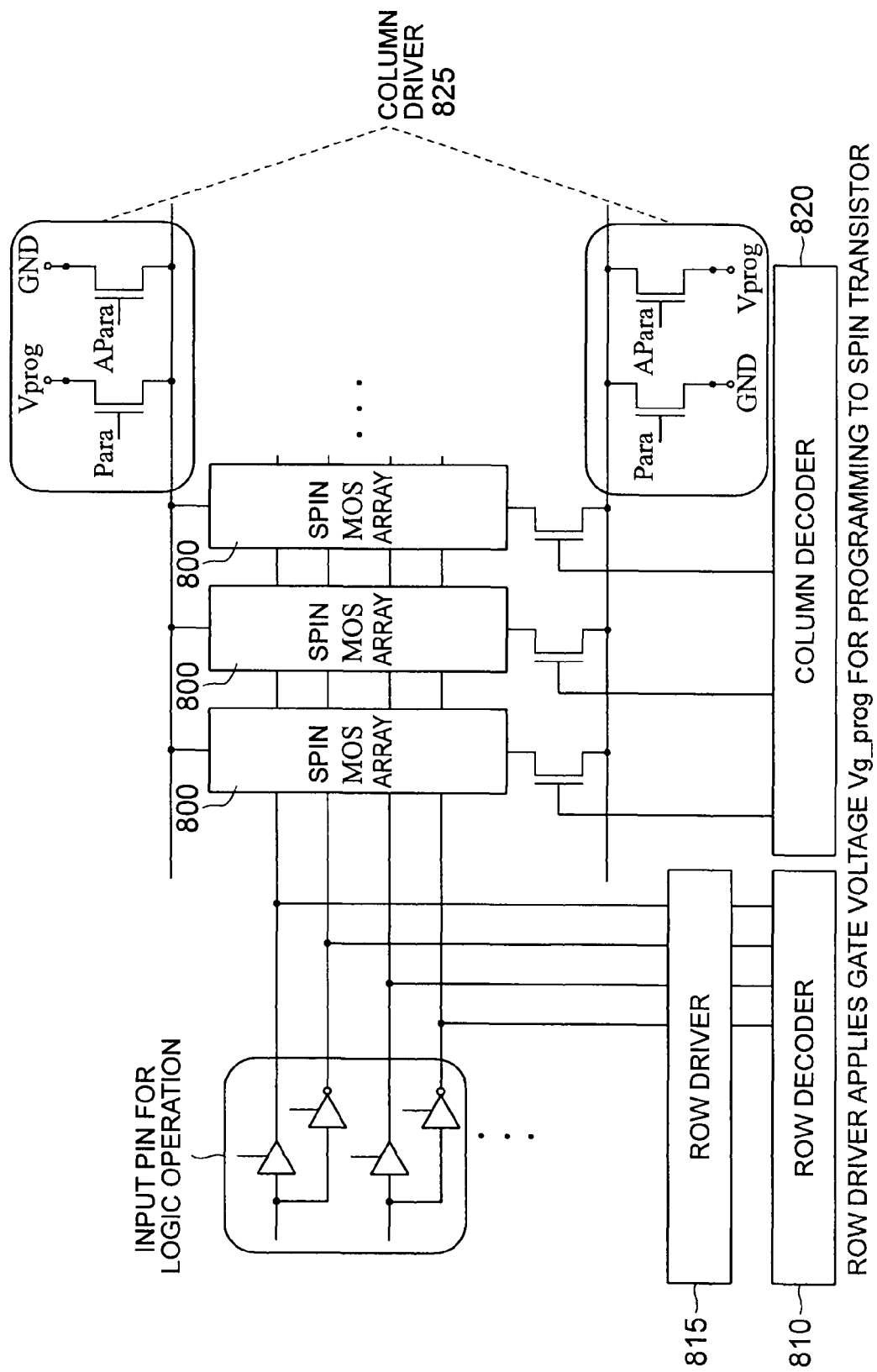
FIG. 23 is a circuit diagram showing a specific example of a circuit for programming.

A specific example of a circuit for programming is shown in FIG. 23. At the time of programming operation, it is desirable to provide an input pin for logic operation with high impedance. Therefore, the input pin for logic operation is formed as a three-state buffer and a three-state inverter. The spin transistor is programmed by a direction of a current let flow between its source and drain. The column driver 825 is adapted to be able to change the direction of the current let flow through the spin transistor. If it is desired to bring the spin transistor into the low resistance state, a signal Para is set to "high" and a signal Apara is set to "low." On the other hand, if it is desired to bring the spin transistor into the high resistance state, the signal Para is set to "low" and the signal Apara is set to "high." If the column driver 825 is not used (for example, during the logic operation), both the signal Para and the signal Apara are set to "low."

Figure 24:
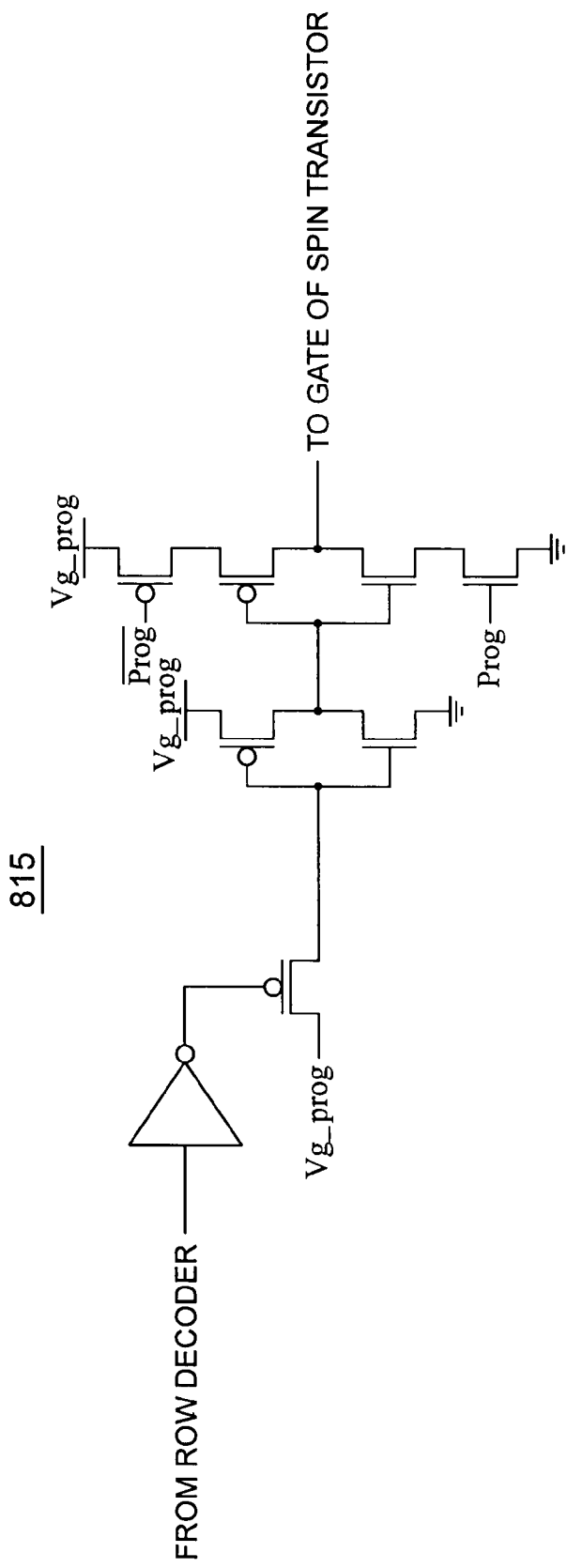
FIG. 24 is a circuit diagram showing a specific example of a row driver.

A circuit diagram of a specific example of the row driver is shown in FIG. 24. The row driver 815 receives the signal of the row decoder 810, and outputs a gate voltage for programming Vg_prog. The row driver 815 is configured to become high in impedance when a signal Prog is "low" by forming an end of an output stage as a three-state buffer.

Figure 25:
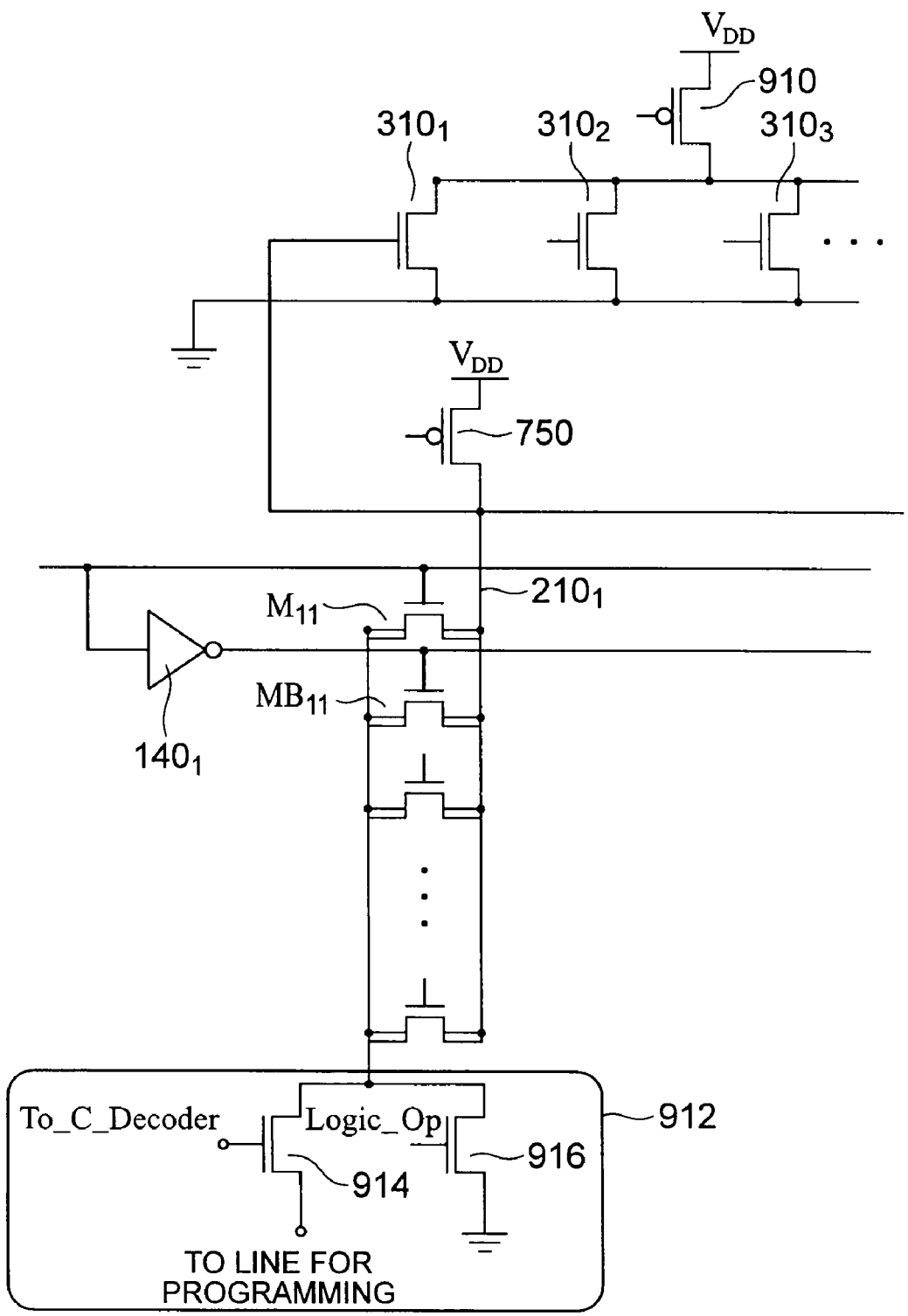
FIG. 25 is a circuit diagram obtained by adding a circuit for programming to the programmable logic circuit according to the first embodiment.

A programmable logic circuit obtained by adding a circuit for programming to the spin MOS array described in the first embodiment is shown in FIG. 25. The circuit for programming includes a pMOSFET 910 and a circuit 912 including nMOSFETs 914 and 916. The pMOSFET 910 is connected at its first end to the power supply $V_{DD}$, and connected at its second end to an output end of the second NOR plane. A first end of the spin MOS array is connected to a NOR line $210_1$, and a second end of the spin MOS array is connected to a line for programming via an nMOSFET 914 and connected to the ground via the nMOSFET 916. When conducting a logical operation, a control signal Logic_Op applied to the nMOSFET 916 at its gate is set to "high" and a control signal To_C_Decoder applied to the nMOSFET 914 at its gate is set to "low."

Figure 26:
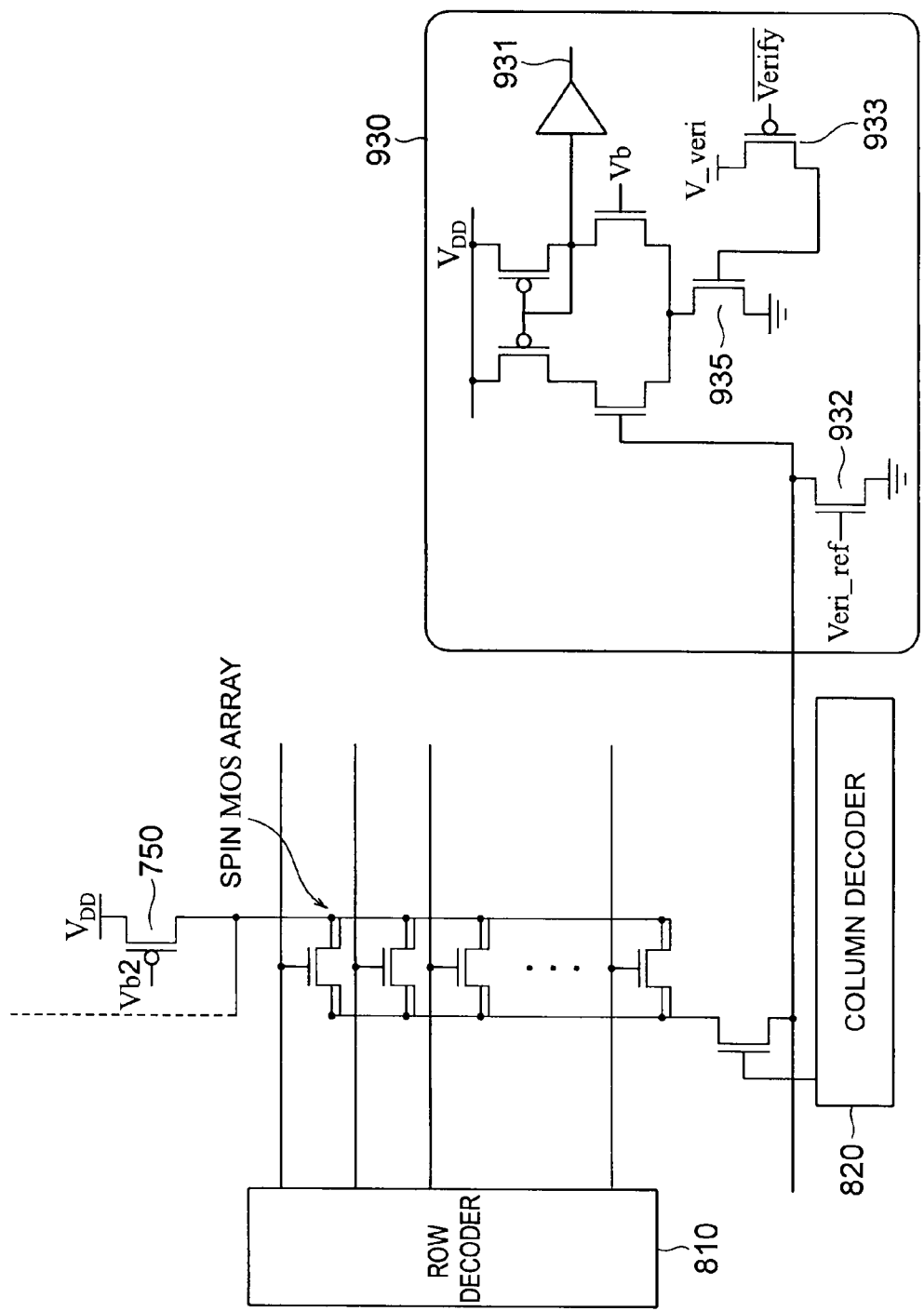
FIG. 26 is a circuit diagram obtained by adding a verify circuit to the programmable logic circuit according to the first embodiment.

A specific example of a verify circuit 930 which verifies whether a spin transistor in the programmable logic circuit according to an embodiment of the present invention is programmed correctly or not after the spin transistor is programmed (subjected to writing) is shown in FIG. 26. A spin transistor to be verified is selected from the spin MOS array by a row decoder 810 and a column decoder 820. The verify circuit 930 is configured so as to output "high" at its output 931 when the selected spin transistor is in the low resistance state and output "low" at its output 931 when the selected spin transistor is in the high resistance state. When using the verify circuit, transistors 932 and 933 are turned on. V_veri is a standard potential required to drive an nMOS transistor 935 in a tail current source.

Figure 27:
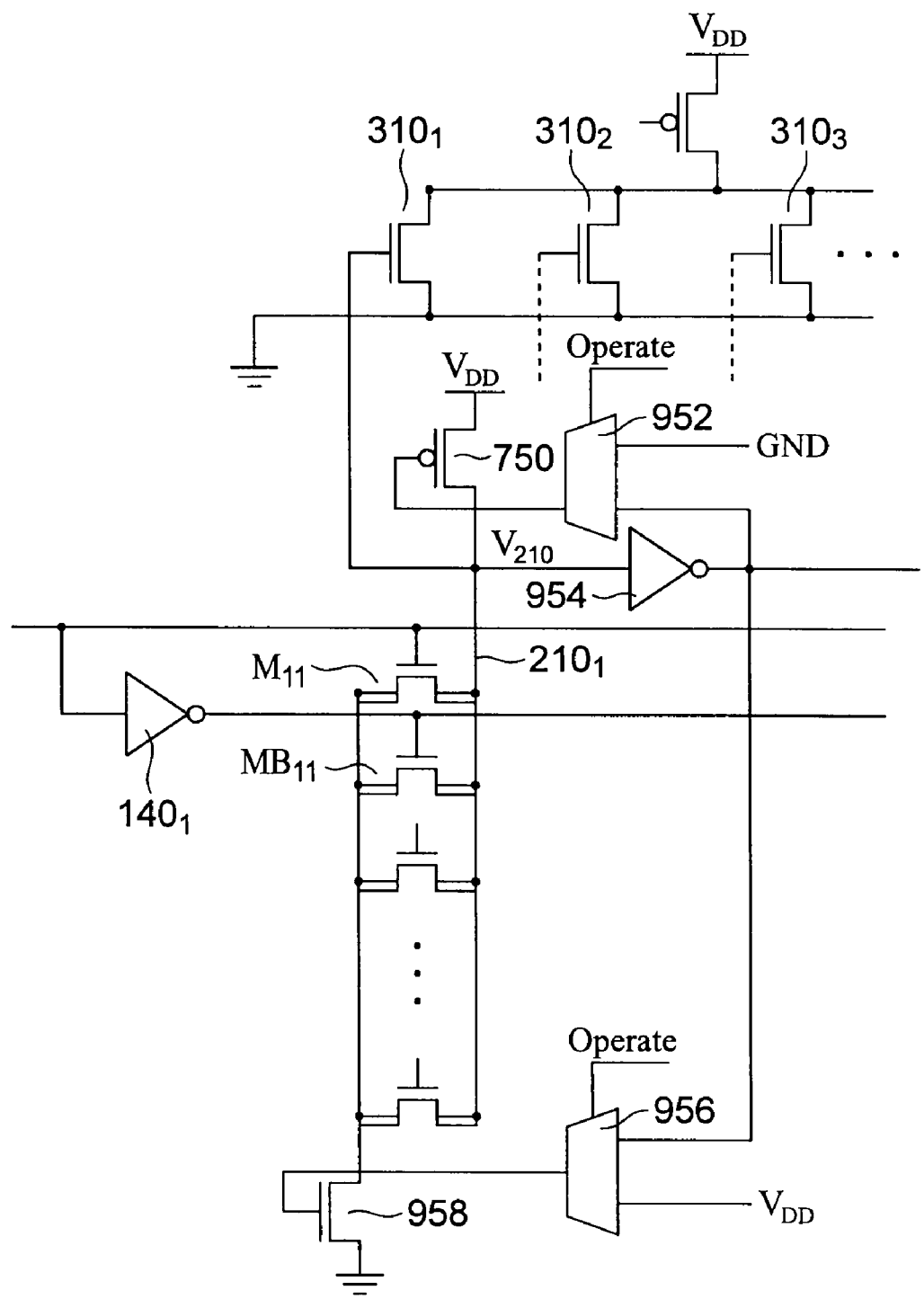
FIG. 27 is a circuit diagram obtained by adding a circuit for reducing power consumption to the programmable logic circuit according to the first embodiment.

A programmable logic circuit obtained by adding a circuit for reducing power consumption to the spin MOS array described in the first embodiment is shown in FIG. 27. The circuit for reducing power consumption includes multiplexers 952 and 956, an inverter 954, and an nMOSFET 958. The ordinary logical operation state and the power consumption reduction state are changed over according to a value of a control signal Operate input to the multiplexers 952 and 956. The inverter 954 receives a potential on a NOR line $210_1$ as its input. The nMOSFET 958 is connected at its first end to the spin MOS array, and connected at its second end to the ground. The nMOSFET 958 receives an output of the multiplexer 956 at its gate. An output of the multiplexer 952 is sent to the gate of the pMOSFET 750 which connects the NOR line $210_1$ and the power supply $V_{DD}$ together.

When the control signal Operate is at the "low" level, the multiplexers 952 and 956 output a signal sent from the inverter 954. When the control signal Operate is at the "high" level, the multiplexer 956 outputs a signal of the "high" level and the multiplexer 952 outputs a signal of the "low" level. It is desirable that the multiplexers 952 and 956 are multiplexers of pass transistor type.

When the control signal Operate is at the "high" level, the multiplexer 956 outputs the signal of the "high" level and consequently the nMOSFET 958 turns on. In the same way, the multiplexer 952 outputs the signal of the "low" level and consequently the pMOSFET 750 also turns on. In this state, the ordinary logical operation is performed.

When the control signal Operate is at the "low" level, both the multiplexers 952 and 956 output a signal supplied from the inverter 954. If a potential $V_{210}$ on the NOR line $210_1$ is high, a signal of the "low" level is output from the inverter 954. Therefore, the pMOSFET 750 turns on and the nMOSFET 958 turns off. And it follows that $V_{210}=V_{DD}$. If the potential $V_{210}$ is low, a signal of the "high" level is output from the inverter 954. Therefore, the pMOSFET 750 turns off and the nMOSFET 958 turns on. And it follows that $V_{210}=0$. In this way, when the control signal Operate is at the "low" level, either the nMOSFET 958 or the pMOSFET 750 turns off. As a result, a through current, which flows through the nMOSFET 958 or the pMOSFET 750, can be reduced remarkably.

The above-described embodiments have been described by taking spin transistors or MRAMs as an example of storage elements in the programmable logic circuit. However, any elements can be used as storage elements in the programmable logic circuit as long as the elements are elements of resistance change type. Hereinafter, elements of resistance change type will be described.

Elements of Resistance Change Type

Elements of resistance change type, such as MRAMs, which exhibit a resistance change in response to a change of the state within the substance, are also considered to be advantageous to making finer. As for the element of resistance change type, the phase change memory, polymer memory, molecule memory, fuse/antifuse memory, and ionic memory are expected as the "emerging device" besides the MRAM (International Technology Roadmap for semiconductors: http://www.itrs.net/).

The fuse/antifuse memory typically has a "metal/insulator/metal" (MIM) structure. Partial dielectric breakdown according to a voltage change occurs by utilizing Joule heat which flows through this structure. The resistance changes because a filament is formed in the substance.

Specifically, there are $NiO_2$ and $TiO_2$. In an element called ionic memory, distribution of positive ions such as Ag or Cu changes and a low resistance filament is formed in the element, resulting in a resistance change. As for the MIM structure utilizing the Mott transition, there are structures such as (Pr, Ca)$MnO_3$, $SrTiO_2$:Cr, Ag/CeO/LCMO and Pt/$TiO_2$/TiN/Pt. Furthermore, Pt/$NiO_2$/Pt can also be utilized as the MIM structure. Furthermore, a structure having $IrO_2$ between NiO and NiO can also be utilized.

According to the embodiments of the present invention, it is possible to suppress the influence upon writing and retaining characteristics as far as possible and prevent software errors from occurring even if the storage elements are made fine.

In addition, the present invention has the following features.

(1) A PLA conforming to finer transistors can be provided by using resistance change type elements on the AND-OR plane.

(2) If spin transistors are used, it becomes possible to construct a PLA which allows a sufficient number of times of rewriting ($\sim 1\times 10^{15}$) and allows reading and writing at high speed and with a low voltage (several V and several tens ns).

(3) If spin transistors are used, a reconfigurable circuit which are robust against software errors and consequently which can be used in an ultimate environment (such as the cosmos, nuclear energy, and an ultrahigh building)

(4) In general, in the magnetoresistive element such as the MRAM, a large MR ratio is demanded. In an embodiment of the present invention, however, the programmable logic circuit is operable even with a small MR ratio.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A programmable logic circuit comprising:
an input circuit configured to receive a plurality of input signals; and
a programmable cell array including a plurality of unit programmable cells arranged in a matrix form, each of the unit programmable cells including a first memory circuit of resistance change type including a first transistor and a second memory circuit of resistance change type including a second transistor, the first and second memory circuits connected in parallel, each gate of the first transistors on same row respectively receiving one input signal, each gate of the second transistors on same row receiving an inverted signal of the one input signal, output terminals of the first and second memory circuits on same column being connected to a common output line.

2. The logic circuit according to claim 1, wherein each of the first and second transistors is a spin transistor.

3. The logic circuit according to claim 1, wherein
the first memory circuit further comprises a first element of resistance change type which is connected in series with the first transistor and which is different from a spin transistor, and
the second memory circuit further comprises a second element of resistance change type which is connected in series with the second transistor and which is different from the spin transistor.

4. A programmable logic circuit comprising:
an input circuit configured to receive a plurality of input signals;
a programmable cell array including a plurality of unit programmable cells arranged in a matrix form, each of the unit programmable cells including a first memory circuit of resistance change type including a first transistor and a second memory circuit of resistance change type including a second transistor, the first and second memory circuits connected in parallel, each gate of the first transistors on same row respectively receiving one input signal, each gate of the second transistors on same row receiving an inverted signal of the one input signal, output terminals of the first and second memory circuits on same column being connected to a common output line; and
third transistors provided so as to be respectively associated with columns in the programmable cell array, wherein
gates of the third transistors are respectively connected to the output lines of the associated columns, and
each of the third transistors turns on or off according to the number of the first and second memory circuits which are in a low resistance state and which are in unit programmable cells on the associated column.

5. The logic circuit according to claim 4, wherein $n_L$ represents the number of the first and second memory circuits which are in a low resistance state and which are on one column in the programmable cell array, $V_{out}$ ($n_L$) represents an output voltage of the column represented as a function of $n_L$, $V_{th}$ represents a threshold voltage of the third transistor provided so as to be associated with the column, and the following condition is satisfied, $$V_{out}(n_L=1) < V_{th} < V_{out}(n_L=0).$$

6. The logic circuit according to claim 4, wherein N represents the total number of the first and second memory circuits on one column in the programmable cell array, $n_L$ represents the number of the first and second memory circuits which are in a low resistance state and which are on the column, $V_{out}$ ($n_L$) represents an output voltage of the column represented as a function of $n_L$, $V_{th}$ represents a threshold voltage of the third transistor provided so as to be associated with the column, and the following condition is satisfied, $$V_{out}(n_L=N) < V_{th} < V_{out}(n_L=N-1).$$

7. The logic circuit according to claim 4, further comprising load resistors provided so as to be respectively associated with columns of the programmable cell array, first ends of the load resistors being connected to the output lines on the associated columns, second ends of the load resistors being connected to a power supply for supplying a voltage $V_{DD}$,
wherein N represents the total number of the first and second memory circuits on one column in the programmable cell array, $R_L$ represents a low resistance value of the first and second memory circuits on the column, $R_H$ represents a high resistance value of the first and second memory circuits on the column, $R_a$ represents a resistance value of the load resistors, $V_{th}$ represents a threshold voltage of the third transistor provided so as to be associated with the column, and the following condition is satisfied, $$\frac{R_a}{R_H}N < \frac{V_{DD} - V_{th}}{V_{th}} < \frac{R_a}{R_H}(N-1) + \frac{R_a}{R_L}.$$

8. The logic circuit according to claim 4, further comprising load resistors provided so as to be respectively associated with columns of the programmable cell array, first ends of the load resistors being connected to the output lines on the associated columns, second ends of the load resistors being connected to a power supply for supplying a voltage $V_{DD}$,
wherein N represents the total number of the first and second memory circuits on one column in the programmable cell array, $R_L$ represents a low resistance value of the first and second memory circuits on the column, $R_H$ represents a high resistance value of the first and second memory circuits on the column, $R_a$ represents a resistance value of the load resistors, $V_{th}$ represents a threshold voltage of the third transistor provided so as to be associated with the column, and the following condition is satisfied, $$\frac{R_a}{R_L}(N-1) + \frac{R_a}{R_H} < \frac{V_{DD} - V_{th}}{V_{th}} < \frac{R_a}{R_L}N.$$

9. The logic circuit according to claim 1, comprising:
a program circuit configured to program one of the first and second memory circuits;
a verify circuit configured to verify whether a programming by the program circuit has been performed accurately;
a sense amplifier circuit configured to sense an output of the programmable cell array; and
a driver circuit configured to provide the input signals to the input circuit.

10. The logic circuit according to claim 9, further comprising:
a row decoder configured to select one row of the programmable cell array; and
a column decoder configured to select one column of the programmable cell array,
wherein
one of the first and second memory circuits in the unit programmable cell located in a position where the selected row intersects the selected column is programmed by the program circuit.

11. The logic circuit according to claim 1, further comprising a switching circuit which performs on the basis of a control signal switching between a logical operation state in which the programmable cell array acts a logical operation and a power consumption reduction state in which a current flowing through an output line on each column in the programmable cell array is reduced.

12. The logic circuit according to claim 1, further comprising another programmable cell array configured to receive an output of the programmable cell array as an input signal.

13. The logic circuit according to claim 1, wherein the input circuit including a switch transistor and inverter connected in parallel each other, the switch transistor outputting the one input signal to the each gate of the first transistors, the inverter outputting the inverted signal of the one input signal to the each gate of the second transistors.

* * * * *